United States Patent [19]

Kataoka

[11] Patent Number: 5,103,342
[45] Date of Patent: Apr. 7, 1992

[54] APOCHROMATIC LENS SYSTEM

[75] Inventor: Yoshikazu Kataoka, Kyoto, Japan

[73] Assignee: Dainippon Screen Mfg. Co., Ltd., Japan

[21] Appl. No.: 579,328

[22] Filed: Sep. 7, 1990

[30] Foreign Application Priority Data

Sep. 8, 1989 [JP] Japan .................................. 1-234474

[51] Int. Cl.$^5$ .......................... G02B 15/02; G02B 9/64
[52] U.S. Cl. ................................................... 359/674
[58] Field of Search .......................... 350/409, 420, 422

[56] References Cited

U.S. PATENT DOCUMENTS

Re. 29,856 12/1978 Kano .................................. 350/422
4,861,983 8/1989 Sasada et al. ....................... 250/235

FOREIGN PATENT DOCUMENTS 55-10884 3/1980 Japan .

*Primary Examiner*—Bruce Y. Arnold
*Assistant Examiner*—Rebecca D. Gass
*Attorney, Agent, or Firm*—Ostrolenk, Faber, Gerb & Soffen

[57] ABSTRACT

An apochromatic lens system is corrected for chromatic aberration at three wavelengths. The apochromatic lens system includes a plane glass and a plane lens which are interchangeable with each other. When the plane glass is disposed on the optical axis of the lens system, the plane glass cooperates with the lens system to correct for chromatic aberration at first and second wavelengths. When the plane lens is disposed on the optical axis instead of the plane glass, the plane lens cooperates with the lens system to correct for chromatic aberration at the first wavelength and at a third wavelength.

8 Claims, 15 Drawing Sheets

SPHERICAL ABERRATION

SPHERICAL ABERRATION

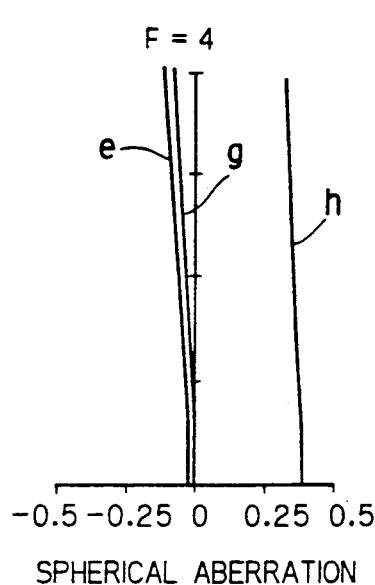
FIG. 4A
SPHERICAL ABERRATION
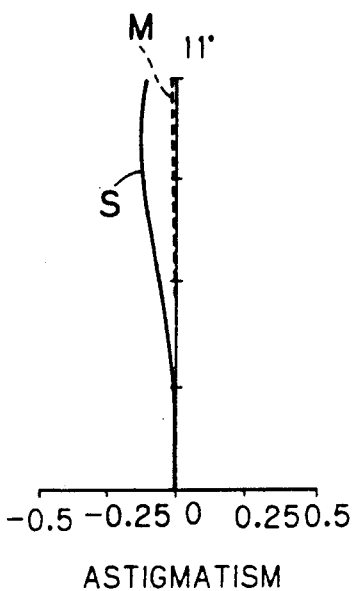
FIG. 5A
ASTIGMATISM
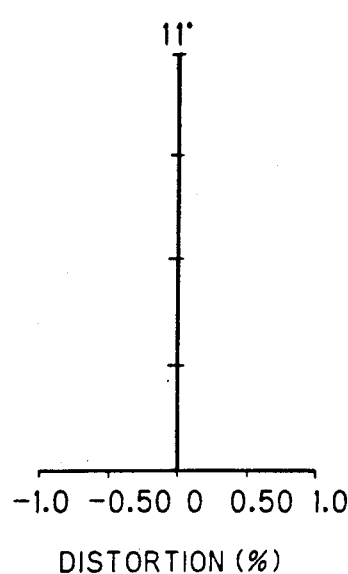
FIG. 6A
DISTORTION (%)
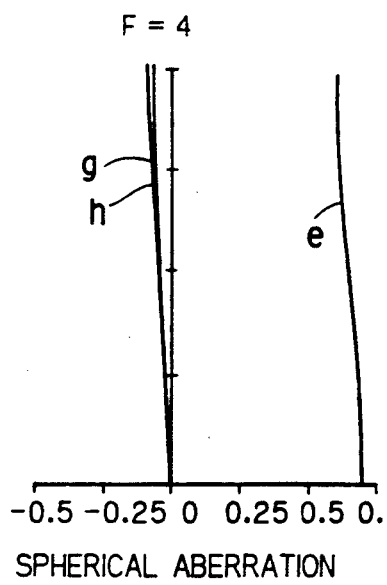
FIG. 4B
SPHERICAL ABERRATION
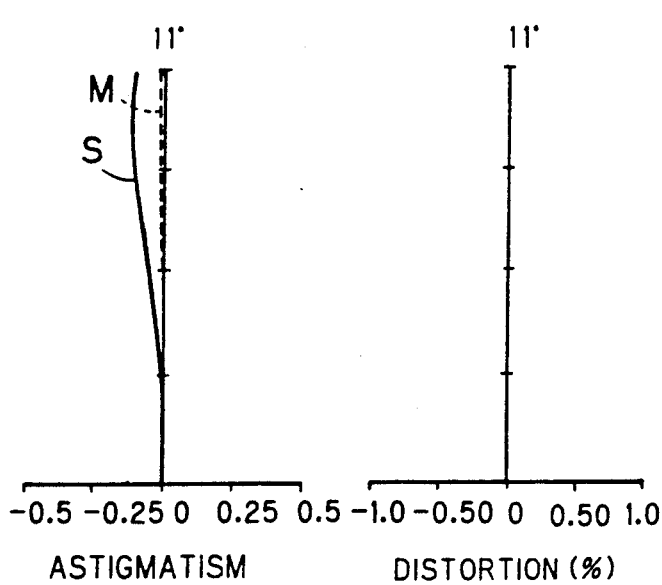
FIG. 5B
ASTIGMATISM
FIG. 6B
DISTORTION (%)

SPHERICAL ABERRATION

ASTIGMATISM

DISTORTION (%)

SPHERICAL ABERRATION

ASTIGMATISM

DISTORTION (%)

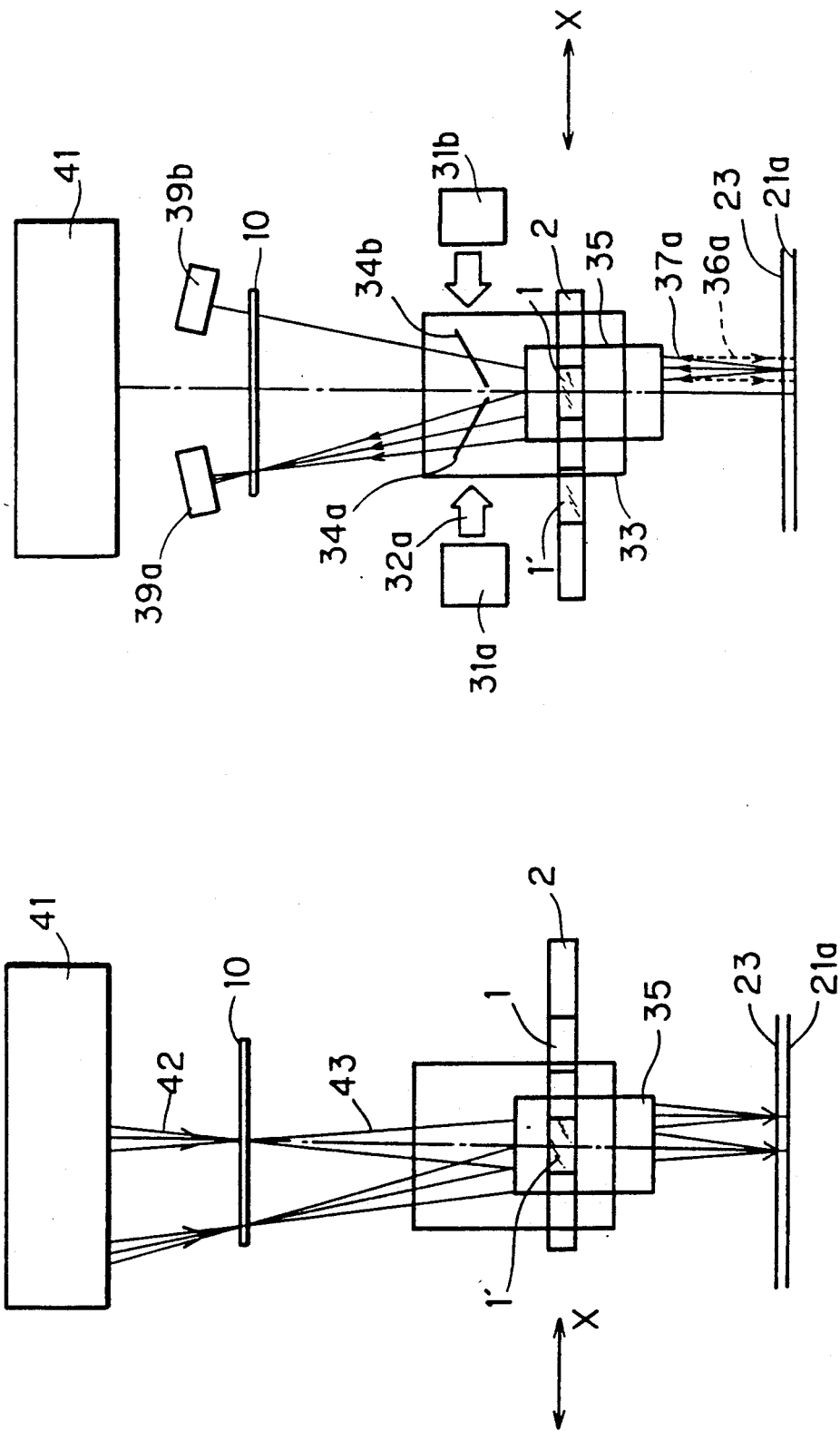

APOCHROMATIC LENS SYSTEM

BACKGROUND OF THE INVENTION

1. Field of the Invention

The present invention relates to an apochromatic lens system which can be corrected for chromatic aberration at a plurality of wavelengths. In particular, the present invention relates to an apochromatic lens system which can be used as a projection lens system. The system is especially suitable for forming a photomask pattern on a substrate of a semiconductor device (such as an integrated circuit).

2. Description of the Prior Art

Exposing through a patterned photomask is one process for fabricating a semiconductor device. In the exposing step, a photoresist coating a semiconductor substrate is exposed to light which is transilluminated through a photomask having a predetermined mask pattern. Generally, a plurality of photomasks, each having an individual mask pattern, are necessary to fabricate a single semiconductor device. Further, the exposing step must be performed for each photomask. Thus, the photomask must be aligned so that its pattern is matched with a pattern previously formed on the semiconductor substrate. In the prior art, a microscope is used to observe the alignment of the photomask.

As a rule, photoresist material is highly sensitive to light with a short wavelength but not sensitive to light with a long wavelength. Therefore, light with a long wavelength (e.g., 546.07 nm (e line)) is used to align the photomask, whereas light with a short wavelength (e.g., 435.83 nm (g line)) is used to expose the photoresist.

Thus, in general, when photomask patterns are formed on a semiconductor substrate, the photomasks are aligned with long wavelength light. Thereafter, the exposing step is performed with short wavelength light. Hence, it is desirable to use a lens system which is corrected for chromatic aberration at the long wavelength as well as at the short wavelength. If a lens system has chromatic aberration at the long wavelength and at the short wavelength, an image of the mask pattern during alignment differs from that during exposure, along an optical axis. In such a case, for each alignment and exposure, either the photomask or the semiconductor substrate must be moved along the optical axis to be in focus. The photomask or the substrate often slips while being moved along the optical axis. As a consequence, all work devoted to alignment is in vain.

On the other hand, to reduce exposure time and improve efficiency, it is desirable to use light with a plurality of wavelengths. For example, exposing a photoresist using light with a wavelength of 435.83 nm (g line) and light with a wavelength of 404.66 nm (h line) is more favorable than exposing using only the g line. However, when lights with two different short wavelengths, e.g., the g line and the h line, are used, a lens system must be corrected for chromatic aberration at at least the g line and the h line.

Therefore, it is advantageous if a photomask and a substrate do not have to be moved along the optical axis for each alignment and exposure. To achieve this, a lens system must be corrected for chromatic aberration at a long wavelength (long wavelength light is used during alignment) and two different short wavelengths (short wavelength lights are used during exposure). However, it is extremely difficult to obtain such a lens system.

SUMMARY OF THE INVENTION

The present invention relates to an apochromatic lens system, comprising: a lens system; a planar glass element (hereinafter referred to as "plane glass") for cooperating with the lens system to be corrected for chromatic aberration at first and second wavelengths when the plane glass is disposed on the optical axis of the lens system; and a lens (hereinafter referred to as a "plane lens") formed by a plano-convex lens and a plano-concave lens, a concave surface of the plano-concave lens facing a convex surface of the plano-convex lens whereby the plane lens is identical to the plane glass in thickness, the plane lens being interchangeable with the plane glass, the plane lens cooperating with the lens system to be corrected for chromatic aberration at the first wavelength and a third wavelength when the plane lens is disposed on the optical axis of the lens system.

A principal object of the present invention is to provide an apochromatic lens system which is corrected for chromatic aberration at three different short wavelengths.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4A and 4B show spherical aberrations of the lens systems shown in FIGS. 3A and 3B, for aligning and for exposing, respectively;

FIGS. 5A and 5B show astigmatisms of the lens systems shown in FIGS. 3A and 3B, respectively;

FIGS. 6A and 6B show distortion of the lens systems shown in FIGS. 3A and 3B, respectively;

FIGS. 20A and 20B are schematic diagrams of an exposing apparatus employing the apochromatic lens system according to the first embodiment of the present invention;

DETAILED DESCRIPTION OF THE PREFERRED EMBODIMENTS

A. Principle of the Invention

Figure 1A:
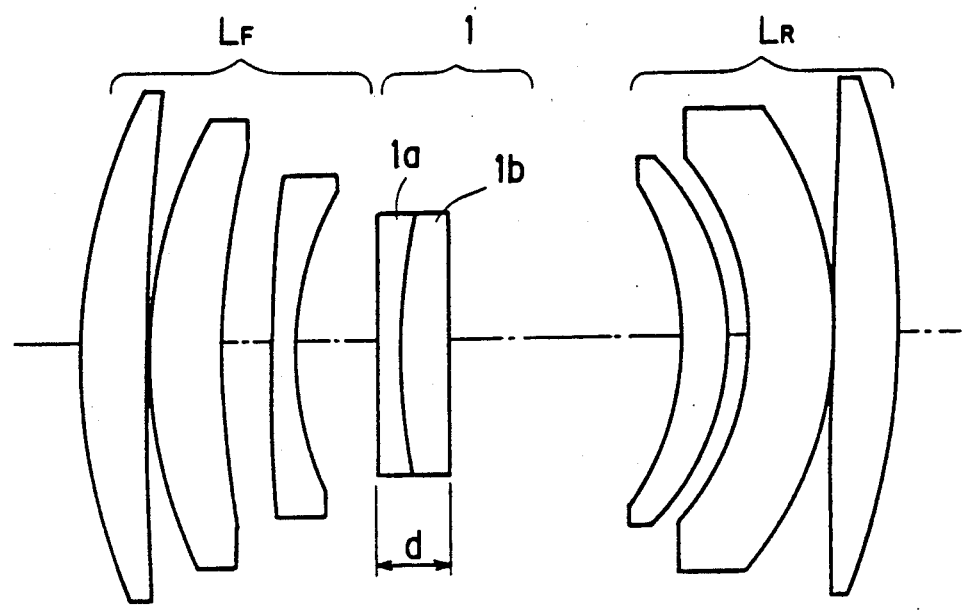
FIGS. 1A and 1B are explanatory diagrams explaining the principle of the present invention.
Figure 1B:
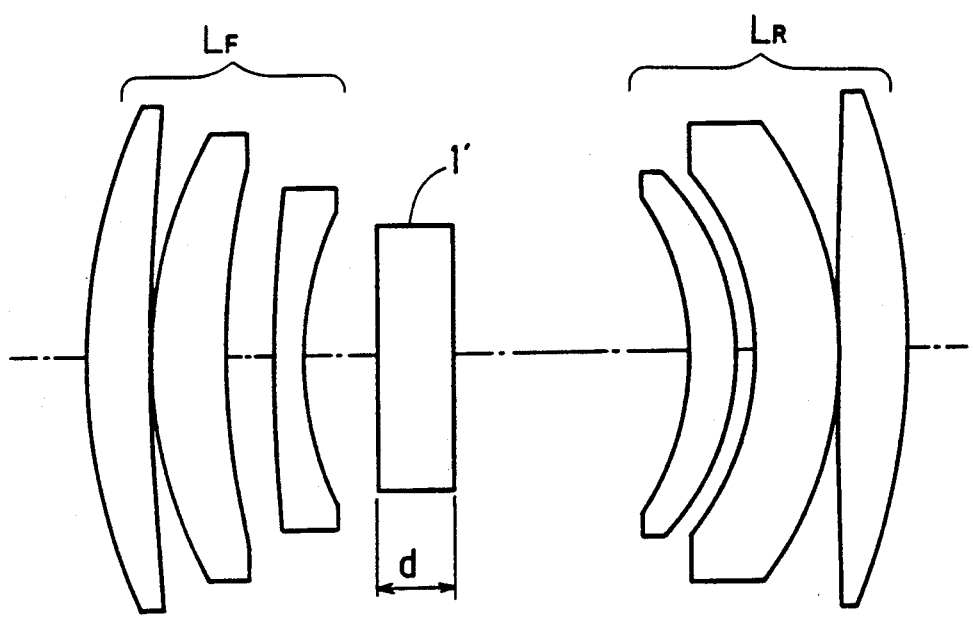

FIGS. 1A and 1B are explanatory diagrams showing the principle of the present invention. FIG. 1A shows an arrangement of lenses for aligning and FIG. 1B shows an arrangement of lenses for exposing. The lens system of FIG. 1A comprises a front lens group $L_F$ disposed toward an object side (left-hand side of the figure) and a rear lens group $L_R$ disposed toward an image formation side (right-hand side of the figure). The lens groups $L_F$ and $L_R$ of FIG. 1A are identical in structure to lens groups $L_F$ and $L_R$ shown in FIG. 1B. However, optical elements 1 and 1' placed between the front lens group $L_F$ and the rear lens group $L_R$, have different structures. The optical elements 1 and 1' are interchangeable. The element 1 is used for alignment and the element 1' is used for exposing.

Figure 2A:
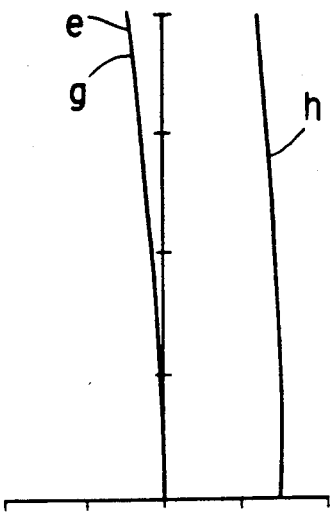
FIGS. 2A and 2B show spherical aberrations of the lens systems of FIGS. 1A and 1B, respectively.
Figure 2B:
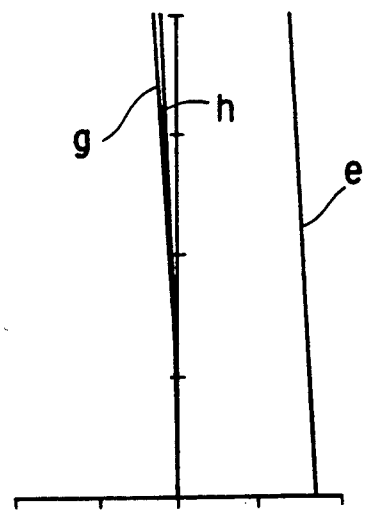

As shown in FIG. 1B, the optical element 1' (for exposing) is made of plane glass with a thickness d. The lens system shown in FIG. 1B is corrected for chromatic aberration at a first-wavelength (such as the g line) and at a second-wavelength (such as the h line) (FIG. 2B). The correction for such chromatic aberration is easily performed by selecting a proper combination of lenses and optical element 1' for the lens system.

The optical element 1 (for aligning) is also made of plane glass. However, the element 1 comprises a plano-concave lens 1a and a plano-convex lens 1b, which are made of different glass materials. The curved surfaces of the two lenses are joined to each other. The materials forming the lenses 1a and 1b have approximately the same index of refraction at the first-wavelength as that of the plane glass 1'. However, the dispersion values of the two glass materials are different from each other. The lens system shown in FIG. 1A has no chromatic aberration at the first-wavelength (the g line) or at a third-wavelength (546.07 nm) (the e line), as shown in FIG. 2A.

It is to be noted that the lenses 1a and 1b have the same index of refraction at the first-wavelength (the g line) as that of the plane glass 1'. This in turn means that the lens systems of FIGS. 1A and 1B are optically equivalent. Hence, the first-wavelength light (the g line) in the alignment lens system (FIG. 1A) is imaged at the same point as in the exposure lens system (FIG. 1B). Further, the alignment lens system has no chromatic aberration at the first and third wavelengths (the g line and the e line) as illustrated in FIG. 2A, while the exposure lens system has no chromatic aberration at the first and second wavelengths (the g and h lines). Therefore, the image point of the third-wavelength light (the e line) during alignment is approximate not only to the image point of the first-wavelength light (the g line) but also to the image point of the second-wavelength light (the h line) during exposure.

In addition, by moving the optical element 1 or 1' along the optical axis, the image size can be altered without altering the image point. This is because the position where the incident light strikes the optical element 1 or 1' varies as the optical element 1 or 1' is moved along the optical axis. Accordingly, if the optical element 1 or 1' is properly located on the optical axis, the image size of the third-wavelength light (the e line) in aligning coincides with that of the first and second-wavelength lights (the g line and the h line) in exposing.

Hence, the image of the e line light during alignment can be approximate to the images of the g line light and the h line light during exposure. This is accomplished by interchanging the optical elements 1 and 1'. As a consequence, a photomask and a substrate do not have to be moved along an optical axis for each alignment and exposure. This increases efficiency and prevents misalignment between the mask pattern and the pattern formed onto the substrate.

B. First Embodiment

Figure 3A:
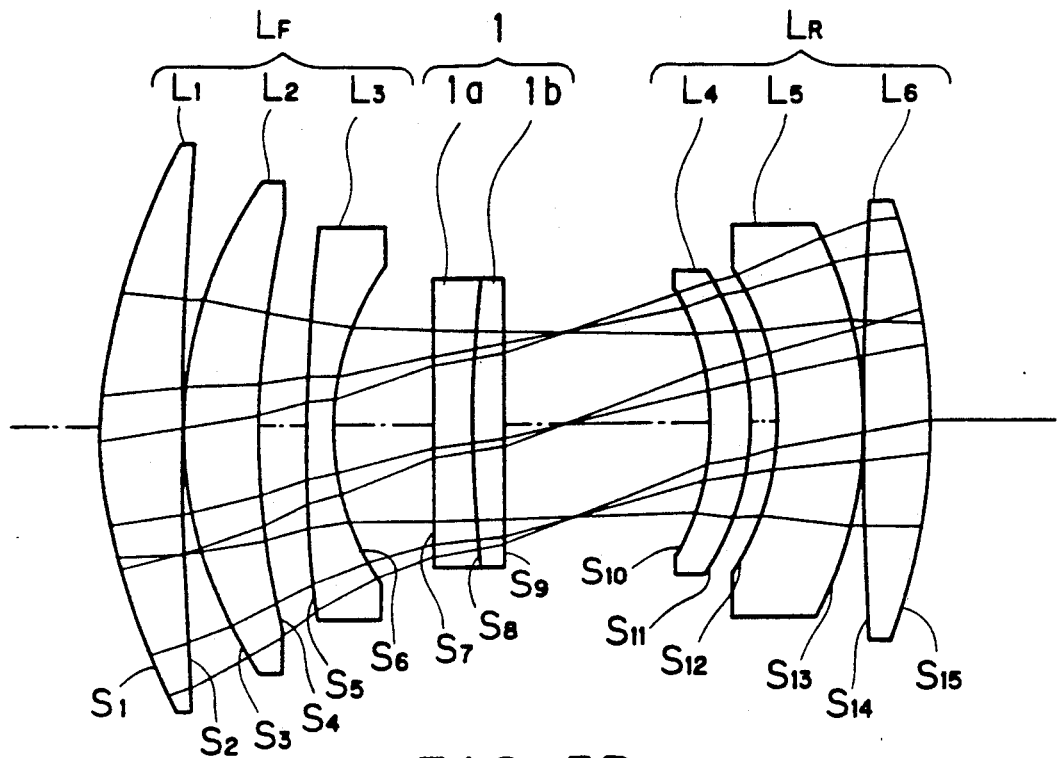
FIGS. 3A and 3B are schematic diagrams of an apochromatic lens system according to a first embodiment of the present invention.
Figure 3B:
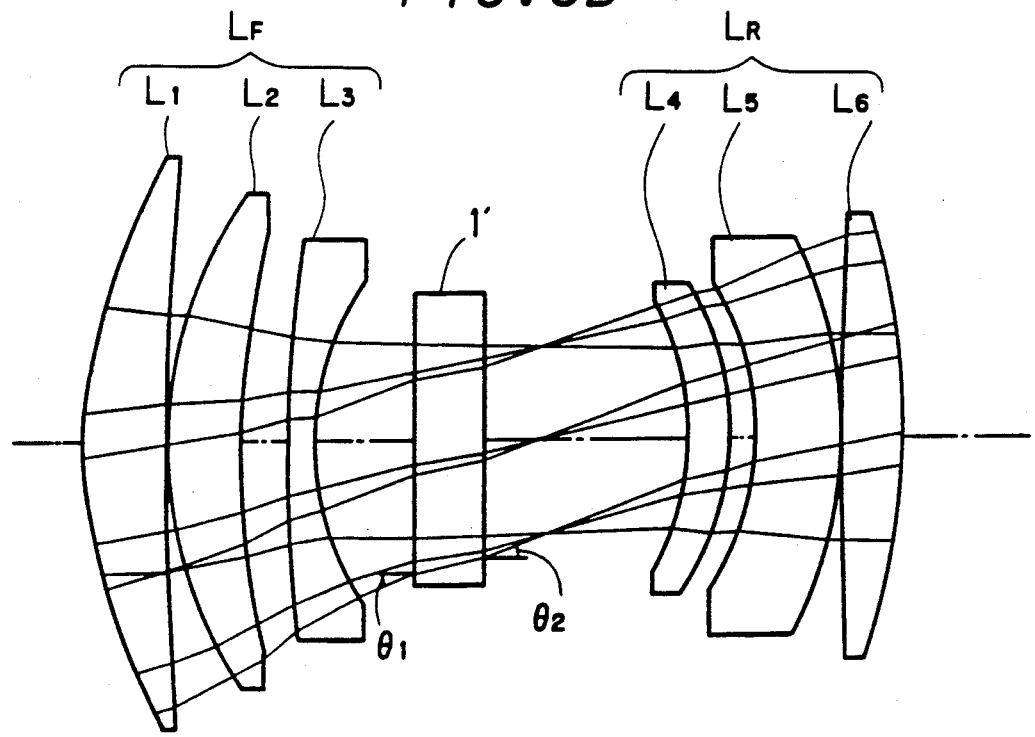

FIGS. 3A and 3B are diagrams of an apochromatic lens system according to a first embodiment of the present invention. FIG. 3A illustrates the structure of the alignment lens system and FIG. 3B illustrates the structure of the exposure lens system. As shown in FIG. 3A, the alignment lens system comprises a front lens group $L_F$, a plane lens 1 and a rear lens group $L_R$, which are serially arranged from an object side (left-hand side of the figure). The front lens group $L_F$ includes first to third lenses $L_1$ to $L_3$, serially arranged from the object side and spaced apart from each other. The spacing between the lenses $L_1$ to $L_3$ will be described later. The plane lens 1 includes plano-concave and plano-convex lenses 1a and 1b. Each of the lenses 1a and 1b has a curved surface. The radius of curvature of the curved surface of lens 1a is equal to that of lens 1b. The curved surfaces of the lenses 1a and 1b are joined to each other, to thereby form the plane lens 1 with parallel planes. The rear lens group $L_R$ includes fourth to sixth lenses $L_4$ to $L_6$, serially arranged from the object side and spaced apart from each other. The spacings between the lenses $L_4$ to $L_6$ will be described later. Table 1A shows lens data for the alignment lens system illustrated in FIG. 3A.

TABLE 1A

| i | radius of curvature $r_i$ | value of thickness or spacing $d_i$ | refractive index at d light | dispersion value $\nu_d$ |
|---|---|---|---|---|
| 1 | 43.41538 | 6.480122 | $n_1 = 1.69350$ | $\nu_1 = 53.3$ |
| 2 | 308.90689 | 0.100000 | | |
| 3 | 34.60635 | 5.714502 | $n_2 = 1.70030$ | $\nu_2 = 47.8$ |

TABLE 1A-continued

| i | radius of curvature $r_i$ | value of thickness or spacing $d_i$ | refractive index at d light | dispersion value $v_d$ |
|---|---|---|---|---|
| 4 | 72.67101 | 3.685353 | | |
| 5 | 143.71997 | 2.194718 | $n_3 = 1.68893$ | $v_3 = 31.2$ |
| 6 | 23.23475 | 7.610805 | | |
| 7 | ∞ | 3.489249 | $n_{1a} = 1.69895$ | $v_{1a} = 30.1$ |
| 8 | 142.20425 | 2.326166 | $n_{1b} = 1.71300$ | $v_{1b} = 53.9$ |
| 9 | ∞ | 15.867274 | | |
| 10 | −21.81461 | 3.333307 | $n_4 = 1.69350$ | $v_4 = 53.3$ |
| 11 | −20.62952 | 2.099601 | | |
| 12 | −21.07478 | 6.774572 | $n_5 = 1.68893$ | $v_5 = 31.2$ |
| 13 | −31.14837 | 0.183597 | | |
| 14 | 1984.65000 | 4.725967 | $n_6 = 1.61272$ | $v_6 = 58.6$ |
| 15 | −58.36856 | | | |

In the table, $r_i$ (i = 1, 2, ... 15) is the radius of curvature of a surface $S_i$. For example, $r_1$ represents the radius of curvature of the convex surface $S_1$ of the first lens $L_1$, and $r_2$ represents the radius of curvature of the surface $S_2$ of the first lens $L_1$, which surface faces the image formation side. The symbol $r_8$ represents the radius of curvature of the surface which joins the lenses $1a$ and $1b$. Symbols $d_1$, $d_3$, $d_5$, $d_7$, $d_8$, $d_{10}$, $d_{12}$ and $d_{14}$ represent the thicknesses of the lenses $L_1$, $L_2$, $L_3$, $1a$, $1b$, $L_4$, $L_5$ and $L_6$, respectively. Symbols $d_2$ and $d_4$ represent the spacings between the lenses $L_1$ to $L_3$. Symbol $d_6$ represents the spacing between the third lens $L_3$ and the plane lens 1, while $d_9$ is the spacing between the fourth lens $L_4$ and the plane lens 1. Symbols $d_{11}$ and $d_{13}$ represent the spacings between the lenses $L_4$ to $L_6$, respectively. Symbols $n_1$ to $n_6$ are the indices of refraction of the first to sixth lenses $L_1$ to $L_6$ with respect to d light (587.56 nm;, respectively. Symbol $n_{1a}$ is the refractive index of the plano-concave lens $1a$ while $n_{1b}$ is the refractive index of the plano-convex lens $1b$. Symbols $v_1$ to $v_6$ denote the dispersion values of the first to sixth lenses $L_1$ to $L_6$, respectively. Symbols $v_{1a}$ and $v_{1b}$ denote the dispersion values of the plano-concave and plano-convex lenses $1a$ and $1b$, respectively. The indices of refraction $n_{ga}$ and $n_{gb}$ of the lenses $1a$ and $1b$ with respect to the g line (435.83 nm) are:

| $n_{ga} = 1.72941$, | $n_{gb} = 1.72939$ |
|---|---|

The focal length f, the total field angle $2\theta$, the F-number F and the magnification M of the apochromatic lens system illustrated in FIG. 3 are:

| f = 100.00, | $2\theta = 22.2°$ |
|---|---|
| F = 4, | M = 0.5 |

The exposure lens system illustrated in FIG. 3B has exactly the same structure as the alignment lens system (FIG. 3A) except hat plane glass 1' is used instead of plane glass 1. Lens data for the exposure lens system (FIG. 3B) is shown in Table 1B.

TABLE 1B

| i | radius of curvature $r_i$ | value of thickness or spacing $d_i$ | refractive index at d light | dispersion value $v_d$ |
|---|---|---|---|---|
| 1 | 43.41538 | 6.480122 | $n_1 = 1.69350$ | $v_1 = 53.3$ |
| 2 | 308.90689 | 0.100000 | | |
| 3 | 34.60635 | 5.714502 | $n_2 = 1.70030$ | $v_2 = 47.8$ |
| 4 | 72.67101 | 3.685353 | | |
| 5 | 143.71997 | 2.194718 | $n_3 = 1.68893$ | $v_3 = 31.2$ |
| 6 | 23.23475 | 7.610805 | | |

TABLE 1B-continued

| i | radius of curvature $r_i$ | value of thickness or spacing $d_i$ | refractive index at d light | dispersion value $v_d$ |
|---|---|---|---|---|
| 7 | ∞ | 5.815415 | | |
| 8 | ... | ... | n = 1.71300 | v = 53.9 |
| 9 | ∞ | 15.867274 | | |
| 10 | −21.81461 | 3.333307 | $n_4 = 1.69350$ | $v_4 = 53.3$ |
| 11 | −20.62952 | 2.099601 | | |
| 12 | −21.07478 | 6.774572 | $n_5 = 1.68893$ | $v_5 = 31.2$ |
| 13 | −31.14837 | 0.183597 | | |
| 14 | 1984.65000 | 4.725967 | $n_6 = 1.61272$ | $v_6 = 58.6$ |
| 15 | −58.36856 | | | |

In the table, symbols $d_7$, n and $v$ denote the thickness, the refractive index with respect to d light and the dispersion value of the plane glass 1', respectively. Other symbols are the same as those in Table 1A. The refractive index $n_g$ of the plane glass 1' with respect to the g line is shown for reference:

$n_g = 1.72939$

The focal length f, the total field angle $2\theta$, the F-number F and the magnification M of the apochromatic lens system illustrated in FIG. 3B are as follows:

| f = 100.00, | $2\theta = 22.2°$ |
|---|---|
| F = 4, | M = 0.5 |

FIGS. 4A and 4B show the spherical aberrations of the alignment and exposure lens systems, respectively. FIGS. 5A and 5B show the astigmatisms of the alignment and exposure lens systems, respectively. FIGS. 6A and 6B show the distortions of the alignment and exposure lens systems, respectively. In FIGS. 4A and 4B, symbols e, g and h denote the spherical aberrations with respect to the e line (546.07 nm), the g line (435.83 nm) and the h line (404.66 nm), respectively. In FIGS. 5A and 5B, symbol S (solid lines) represents a sagittal image surface with respect to the g line, and symbol M (dotted lines) represents a meridional image surface with respect to the g line.

In the first embodiment of the present invention, the plane glass 1' and the plano-convex lens $1b$ are made of the same glass material (hereinafter referred to as "glass material A") while the plano-concave lens $1a$ is made of glass material (hereinafter referred to as "glass material B") which is approximate to the glass material A in refractive index but different in dispersion value. This can be seen in Tables 1A and 1B. However, this combination of materials is not limiting. For instance, the plane glass 1' and the plano-concave lens $1a$ can be made of the glass material A while the plano-convex lens $1b$ can be made of the glass material B. Other examples of materials are shown in Table 2.

TABLE 2

| glass material | $n_g$ | $n_e$ | $v_e$ |
|---|---|---|---|
| BK7 | 1.52621 | 1.51825 | 63.9 |
| KF3 | 1.52628 | 1.51678 | 54.4 |
| SK1 | 1.62370 | 1.61283 | 56.2 |
| F5 | 1.62382 | 1.60718 | 37.7 |
| SK11 | 1.57531 | 1.56605 | 60.5 |
| LLF3 | 1.57522 | 1.56296 | 46.7 |
| LaK11 | 1.67255 | 1.66103 | 57.1 |
| SF2 | 1.67253 | 1.65223 | 33.6 |
| LaK12 | 1.69312 | 1.68082 | 55.1 |
| SF19 | 1.69298 | 1.67158 | 32.8 |
| LaK8 | 1.72944 | 1.71615 | 53.6 |
| SF15 | 1.72933 | 1.70443 | 29.9 |
| laF010 | 1.76205 | 1.74679 | 49.1 |

TABLE 2-continued

| glass material | $n_g$ | $n_e$ | $v_e$ |
|---|---|---|---|
| SF10 | 1.76191 | 1.73429 | 28.2 |

C. Second Embodiment

The g line (435.83 nm) is employed as the first wavelength light in the first embodiment. The h line (404.66 nm) can be employed instead, as will be hereinafter described.

Figure 7A:
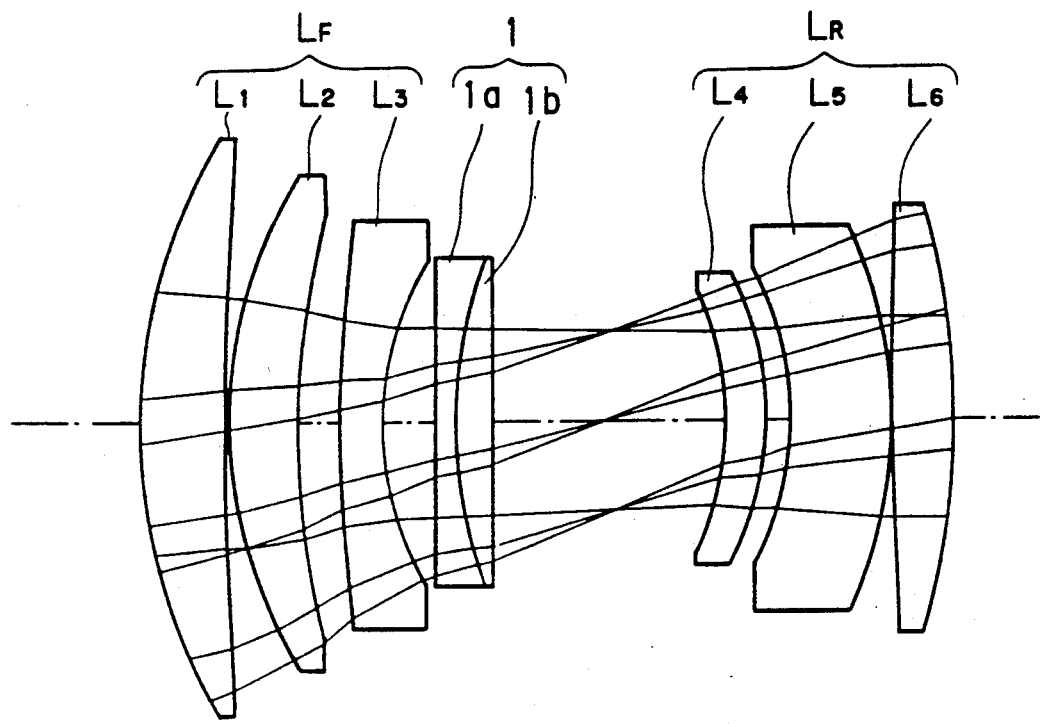
FIGS. 7A and 7B are schematic diagrams of an apochromatic lens system according to a second embodiment of the present invention.
Figure 7B:
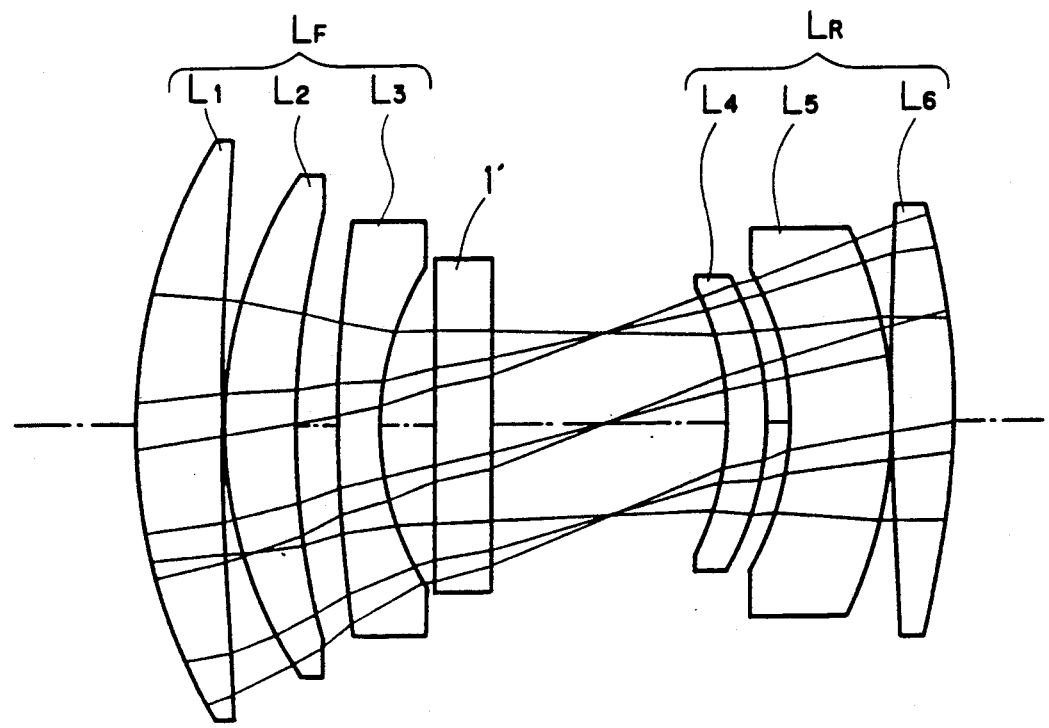

FIGS. 7A and 7B are schematic diagrams of an apochromatic lens system according to a second embodiment of the present invention. FIG. 7A illustrates an alignment lens system and FIG. 7B illustrates an exposure lens system. The structures of these lens systems are identical to those of the first embodiment. Therefore, the descriptions thereof are omitted here.

Table 3A shows the lens data for the alignment lens system illustrated in FIG. 7A.

TABLE 3A

| i | radius of curvature $r_i$ | value of thickness or spacing $d_i$ | refractive index at d light | dispersion value $v_d$ |
|---|---|---|---|---|
| 1 | 44.04882 | 6.629734 | $n_1 = 1.69350$ | $v_1 = 53.3$ |
| 2 | 346.75669 | 0.100000 | | |
| 3 | 35.06825 | 5.776424 | $n_2 = 1.70030$ | $v_2 = 47.8$ |
| 4 | 74.14126 | 3.245853 | | |
| 5 | 149.61818 | 3.244472 | $n_3 = 1.68893$ | $v_3 = 31.2$ |
| 6 | 23.37074 | 3.822617 | | |
| 7 | ∞ | 2.000000 | $n_{1a} = 1.60729$ | $v_{1a} = 49.2$ |
| 8 | 34.40785 | 3.000000 | $n_{1b} = 1.61025$ | $v_{1b} = 56.5$ |
| 9 | ∞ | 18.486614 | | |
| 10 | −23.73420 | 3.291906 | $n_4 = 1.69350$ | $v_4 = 53.3$ |
| 11 | −22.17396 | 1.938192 | | |
| 12 | −22.29975 | 7.911825 | $n_5 = 1.68893$ | $v_5 = 31.2$ |
| 13 | −33.86792 | 0.100000 | | |
| 14 | 991.26953 | 4.624920 | $n_6 = 1.61272$ | $v_6 = 58.6$ |
| 15 | −61.12865 | | | |

The refractive indices of the plano-concave and plano-convex lenses 1a and 1b with respect to the h line (404.66 nm) are shown below for reference:

$n_{ha} = 1.62872,$   $n_{hb} = 1.62863$

The focal length f, the total field angle $2\theta$, the F-number F and the magnification M of the apochromatic lens system illustrated in FIG. 7A are as follows:

f = 100.00,   $2\theta = 22.2°$
F = 4,   M = 0.5

The exposure lens system illustrated in FIG. 7B has the data shown in Table 3B.

TABLE 3B

| i | radius of curvature $r_i$ | value of thickness or spacing $d_i$ | refractive index at d light | dispersion value $v_d$ |
|---|---|---|---|---|
| 1 | 44.04882 | 6.629734 | $n_1 = 1.69350$ | $v_1 = 53.3$ |
| 2 | 346.75669 | 0.100000 | | |
| 3 | 35.06825 | 5.776424 | $n_2 = 1.70030$ | $v_2 = 47.8$ |
| 4 | 74.14126 | 3.245853 | | |
| 5 | 149.61818 | 3.244472 | $n_3 = 1.68893$ | $v_3 = 31.2$ |
| 6 | 23.37074 | 3.822617 | | |
| 7 | ∞ | 5.000000 | | |
| 8 | ... | | $n = 1.61025$ | $v = 56.5$ |
| 9 | ∞ | 18.486614 | | |
| 10 | −23.73420 | 3.291906 | $n_4 = 1.69350$ | $v_4 = 53.3$ |
| 11 | −22.17396 | 1.938192 | | |
| 12 | −22.29975 | 7.911825 | $n_5 = 1.68893$ | $v_5 = 31.2$ |
| 13 | −33.86792 | 0.100000 | | |
| 14 | 991.26953 | 4.624920 | $n_6 = 1.61272$ | $v_6 = 58.6$ |
| 15 | −61.12865 | | | |

The refractive index of the plane glass 1' with respect to the h line (404.66 nm) is given below for reference:
$n_h = 1.62863$ The focal length f, the total field angle $2\theta$, the F-number F and the magnification M of the apochromatic lens system illustrated in FIG. 7B are as follows:

f = 100.00,   $2\theta = 22.2°$
F = 4,   M = 0.5

Figure 8A:
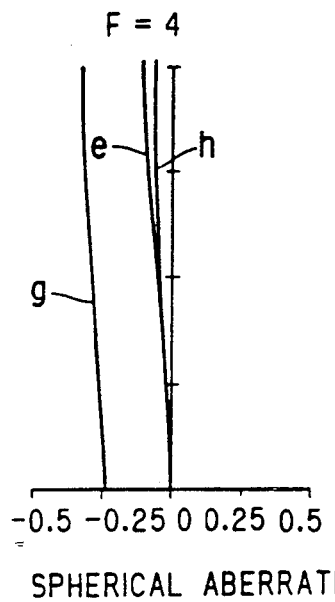
FIGS. 8A and 8B show spherical aberrations of the lens systems shown in FIGS. 7A and 7B, for aligning and for exposing, respectively.
Figure 9A:
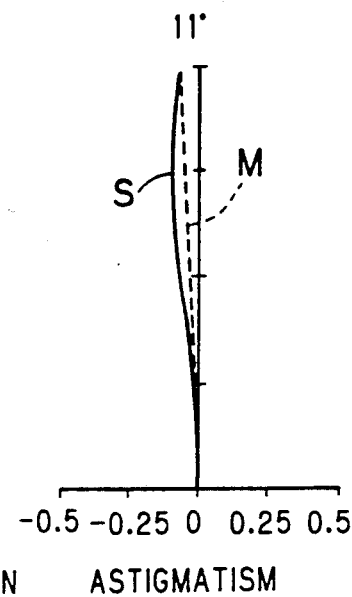
FIGS. 9A and 9B show astigmatisms of the lens systems shown in FIGS. 7A and 7B, respectively.
Figure 10A:
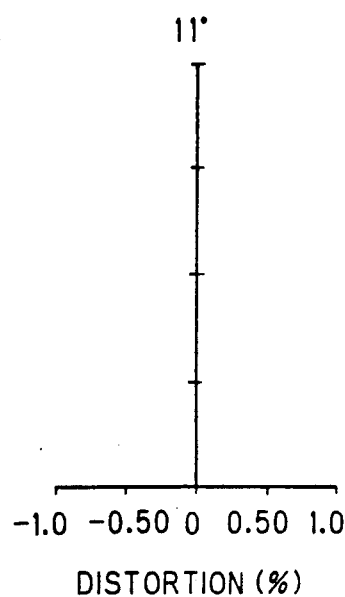
FIGS. 10A and 10B show distortion aberrations of the lens systems shown in FIGS. 7A and 7B, respectively.
Figure 8B:
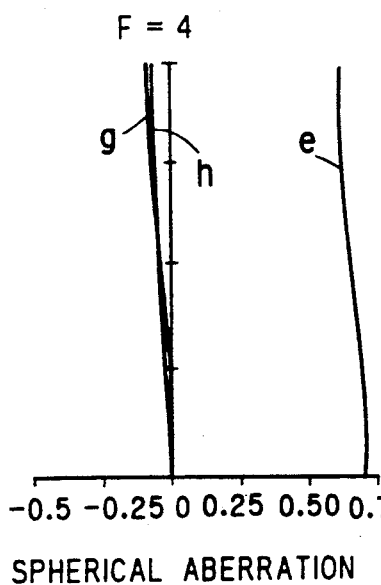
Figure 9B:
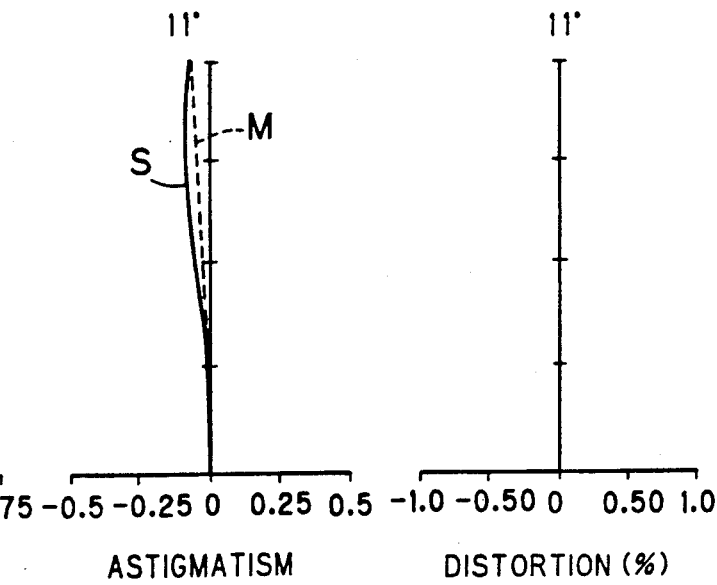
Figure 10B:
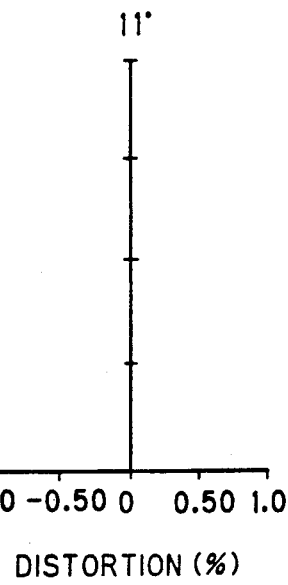

FIGS. 8A and 8B show the spherical aberrations of the alignment and exposure lens systems, respectively. FIGS. 9A and 9B show the astigmatisms of the alignment and exposure lens systems, respectively. FIGS. 10A and 10B show the distortion aberrations of the alignment and exposure lens systems, respectively.

In FIGS. 9A and 9B, symbol S represents a sagittal image surface, and symbol M represents a meridional image surface.

Also, in the second embodiment, the plane glass 1' and the plano-convex lens 1b are made of the same glass material while the plano-concave lens 1a is made of the glass material which is approximate to the mentioned glass material in refractive index but different from the same in dispersion value, as in the first embodiment. However, other combinations of materials may be used. Examples are set forth in Table 4.

TABLE 4

| glass material | $n_h$ | $n_e$ | $v_e$ |
|---|---|---|---|
| SK1 | 1.62863 | 1.61283 | 56.2 |
| BaF5 | 1.62872 | 1.61023 | 48.9 |
| SK16 | 1.63778 | 1.62287 | 60.0 |
| KzFS4 | 1.63776 | 1.61673 | 43.6 |

D. Effect of the First and Second Embodiments

The images produced by the alignment lens system illustrated in FIGS. 3A or 7A when the system is used with the third-wavelength light (the e line), coincide with the images produced by the exposure lens system (FIGS. 3B, 7B) when the exposure lens system is used with the first and second-wavelength light (the g line and the h line). Alignment of the photomask is performed using the e line after locating the plane lens 1 as shown in FIG. 3A (or 7A). Next, the plane lens 1 is replaced by the plane glass 1' as shown in FIG. 3B (or 7B). Then, exposure is performed without adjusting the location of the photomask or the substrate. Thus, exposure efficiency is improved, and at the same time, the problem of slippage of the photomask or the substrate is avoided.

Figure 11A:
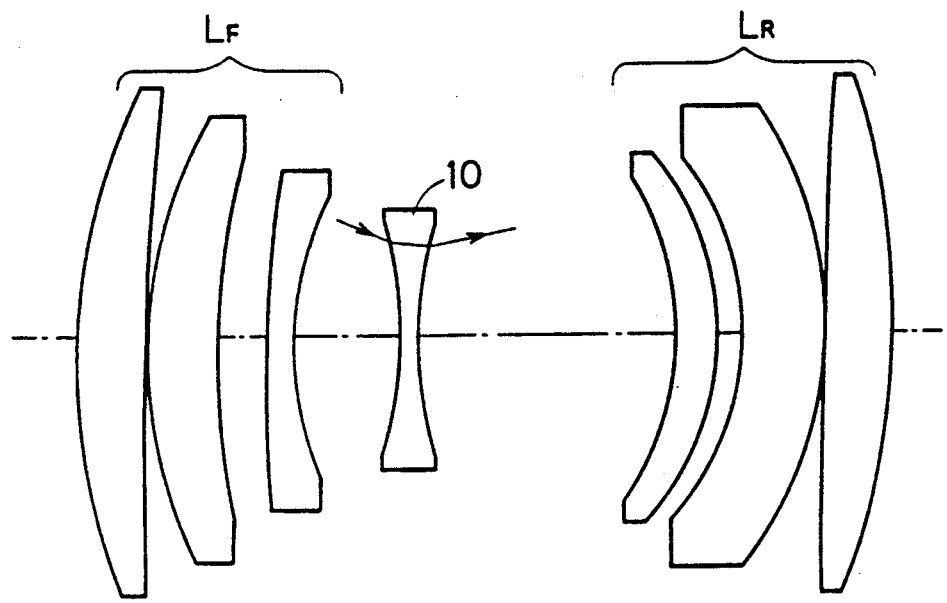
FIGS. 11A and 11B are schematic diagrams of another lens system for comparison.
Figure 11B:
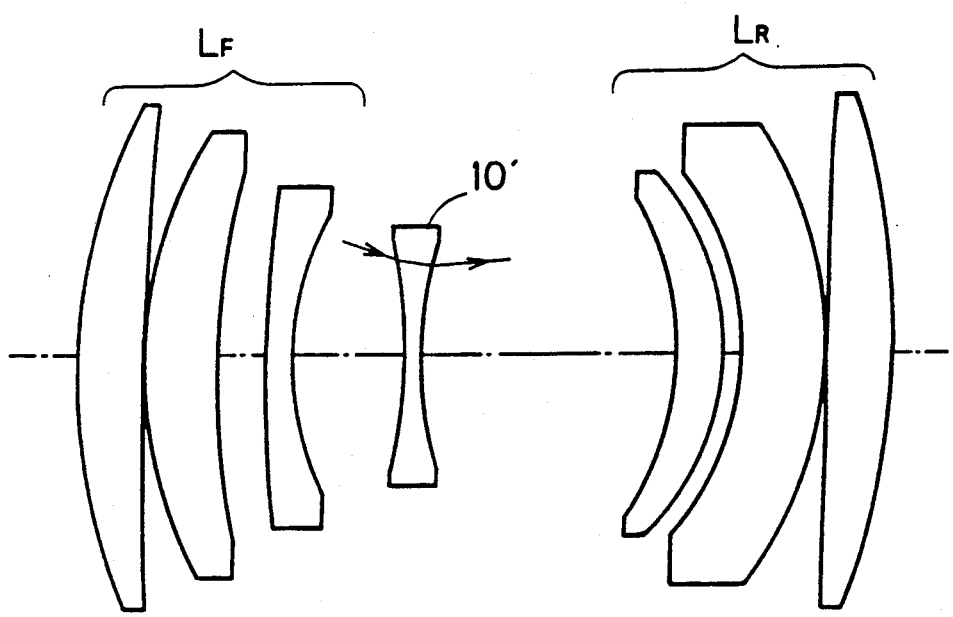

Other appropriate lenses, for example, two concave lenses may be substituted for the interchangeable optical elements 1, 1' to achieve certain objects of the present invention: A concave lens 10 (FIG. 11A) can be employed for alignment instead of the plane lens 1 to correct for chromatic aberration at the first and third wavelengths. And a convex lens 10' (FIG. 11B) can be employed instead of the plane glass 1' to correct for chromatic aberration at the first and second wavelengths.

In such a case, however, highly accurate replacement of the lenses 10 and 10' is required because the direction of light incident upon the lenses 10, 10' is largely different from the direction of light outgoing therefrom. The position of the lenses 10 and 10' has considerable influence on image size in this lens structure. In the first and second embodiments of the present invention, in contrast, the parallel plane shape of the optical elements 1, 1' causes the direction of the incident light to be approximate to the direction of the outgoing light. Consequently, the influence of the position of the optical element 1 or 1' on image size is negligible, even if the optical element 1 or 1' is not placed precisely on the optical axis. During alignment in particular, there is no influence on image size since the plane glass 1' enables the direction of the incident light to be identical to the direction of the outgoing light. In other words, the angle of the incident light $\theta_1$ is identical to that of the outgoing light $\theta_2$ (FIG. 3B). Accordingly, the optical elements 1 and 1' do not have to be replaced as accurately as would be the case with the concave lenses 10 and 10'.

E. Third and Fourth Embodiments

An apochromatic le-s system suitable for photoetching has been described in detail in the previous part of the specification. This lens system has no chromatic aberration at a long wavelength (used for aligning) and at two different short wavelengths (used for exposing). Now, a correction for chromatic aberration at three different wavelength lights will be described. Such corrections can be achieved by combining glass materials.

E-1. Third Embodiments

Figure 12A:
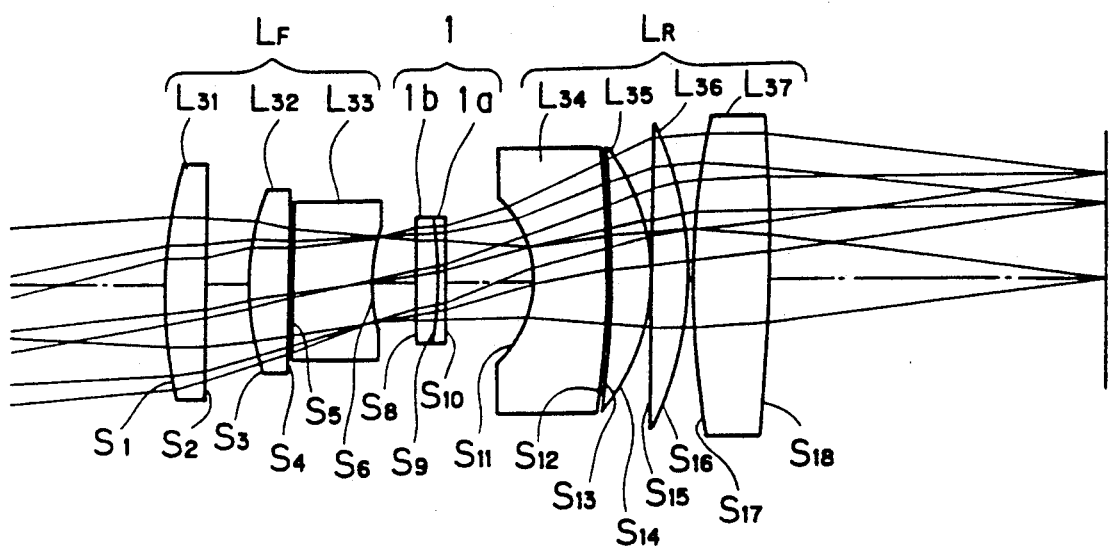
FIGS. 12A and 12B are schematic diagrams of an apochromatic lens system according to a third embodiment of the present invention.
Figure 12B:
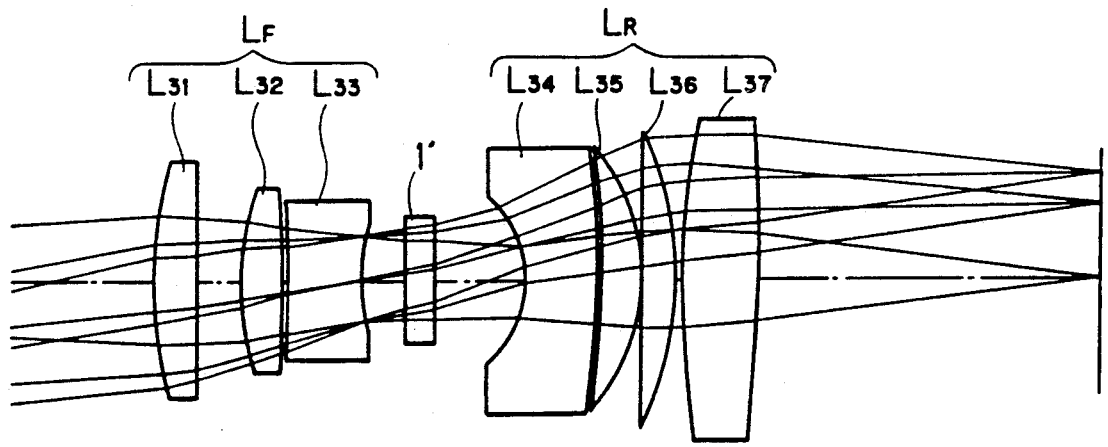

FIGS. 12A and 12B are schematic diagrams of an apochromatic lens system according to a third embodiment of the present invention. FIG. 12A shows a first structure of the lens system and FIG. 12B shows a second structure of the lens system. The first lens system includes a front lens group $L_F$, a plane lens 1 and a rear lens group $L_R$, arranged serially from an object side (left-hand side of the figure). The front lens group $L_F$ includes first to third lenses $L_{31}$ to $L_{33}$, serially arranged from the object side and spaced apart from each other. The spacing between the three lenses will be described later. The plane lens 1 includes plano-concave and plano-convex lenses 1a and 1b having the same curvature. The curved surfaces of the plano-concave and plano-convex lenses 1a and 1b are joined to each other such that the plane lens 1 has parallel planes. The rear lens group $L_R$ includes fourth to sixth lenses $L_{34}$ to $L_{36}$, serially arranged from the object side and spaced apart from each other. The spacing between these three lenses will be described later. Table 5A shows the lens data of the lens system illustrated in FIG. 12A.

TABLE 5A

| j | radius of curvature $r_j$ | value of thickness or spacing $d_j$ | refractive index at d light | dispersion value $\nu_d$ |
|---|---|---|---|---|
| 1 | 18.91552 | 2.292062 | $n_1 = 1.74400$ | $\nu_1 = 44.8$ |
| 2 | −381.41801 | 2.233704 | | |

TABLE 5A-continued

| j | radius of curvature $r_j$ | value of thickness or spacing $d_j$ | refractive index at d light | dispersion value $\nu_d$ |
|---|---|---|---|---|
| 3 | 12.28960 | 2.223651 | $n_2 = 1.74400$ | $\nu_2 = 44.8$ |
| 4 | −98.01945 | 0.097696 | | |
| 5 | −65.59137 | 3.888889 | $n_3 = 1.75520$ | $\nu_3 = 27.5$ |
| 6 | 7.92120 | 0.283150 | | |
| 7 | ... | 2.040326 | | |
| 8 | ∞ | 0.972222 | $n_{1a} = 1.78472$ | $\nu_{1a} = 25.7$ |
| 9 | −84.49344 | 0.444444 | $n_{1b} = 1.78800$ | $\nu_{1b} = 47.4$ |
| 10 | ∞ | 4.409125 | | |
| 11 | −5.99319 | 3.712611 | $n_4 = 1.75520$ | $\nu_4 = 27.5$ |
| 12 | −86.28751 | 0.048162 | | |
| 13 | −71.18235 | 2.143318 | $n_5 = 1.69350$ | $\nu_5 = 53.2$ |
| 14 | −10.94487 | 0.027778 | | |
| 15 | −226.45067 | 1.809814 | $n_6 = 1.74400$ | $\nu_6 = 44.8$ |
| 16 | −17.83232 | 0.339249 | | |
| 17 | 41.06543 | 3.888889 | $n_7 = 1.74400$ | $\nu_7 = 44.8$ |
| 18 | −86.74715 | | | |

In the table, $r_j (j=1, 2, \ldots, 6, 8 \ldots, 18)$ is the radius of curvature of a lens surface $S_j$. The symbol $r_9$ represents the radius of curvature of a joining surface $S_9$ of the plan o-concave and plano-convex lenses 1a and 1b. Symbols $d_1, d_3, d_5, d_8, d_9, d_{11}, d_{13}, d_{15}$ and $d_{17}$ are the thicknesses of the lenses $L_{31}, L_{32}, L_{33}$, 1a, 1b and $L_{34}$ to $L_{37}$, respectively. Symbols $d_2$ and $d_4$ are the spacings between the adjacent lenses of the three lenses $L_{31}$ to $L_{33}$. Symbol $d_6$ is the spacing between the third lens $L_{33}$ and a stop (not shown in the figure), while $d_7$ is the spacing between the stop and the plane lens 1. Symbols $d_{12}, d_{14}$ and $d_{16}$ are the spacings between the adjacent lenses of the four lenses $L_{34}$ to $L_{37}$. Symbols $n_1$ to $n_7$ are indices of refraction of the lenses $L_{31}$ to $L_{37}$ with respect to the d light (587.56 nm), respectively. Symbol $n_{1a}$ is the index of refraction of the plano-concave lens 1a while $n_{1b}$ is that of the plano-convex lens 1b. Symbols $\nu_1$ to $\nu_7$ denote the dispersion values of the lenses $L_{31}$ to $L_{37}$, respectively, and $\nu_{1a}$ to $\nu_{1b}$ denote the dispersion values of the lenses 1a and 1b, respectively. The indices of refraction $n_{ea}$ and $n_{eb}$ of the plano-concave and the plano-convex lenses 1a and 1b with respect to the e line (546.07 nm) are given below for reference.

| $n_{ea} = 1.79191$, | $n_{eb} = 1.79196$ |
|---|---|

The focal length f-, the total field angle $2\theta$, the distance IOD between the object and the image, and the magnification M of the apochromatic lens system are as follows:

| f = 30.494, | $2\theta = 18.2°$ |
|---|---|
| IOD = 100.00, | M = 0.5 |

The second (exposure) lens system (FIG. 12B) is exactly the same as the first lens system except that the plane glass 1' is used instead of the plane glass 1. The lens data of the exposure lens system are shown in Table 5B.

TABLE 5B

| j | radius of curvature $r_j$ | value of thickness or spacing $d_j$ | refractive index at d light | dispersion value $\nu_d$ |
|---|---|---|---|---|
| 1 | 18.91552 | 2.292062 | $n_1 = 1.74400$ | $\nu_1 = 44.8$ |
| 2 | −381.41801 | 2.233704 | | |
| 3 | 12.28960 | 2.223651 | $n_2 = 1.74400$ | $\nu_2 = 44.8$ |
| 4 | −98.01945 | 0.097696 | | |

TABLE 5B-continued

| j | radius of curvature $r_j$ | value of thickness or spacing $d_j$ | refractive index at d light | dispersion value $v_d$ |
|---|---|---|---|---|
| 5 | −65.59137 | 3.888889 | $n_3 = 1.75520$ | $v_3 = 27.5$ |
| 6 | 7.92120 | 0.283150 | | |
| 7 | ... | 2.040326 | | |
| 8 | ∞ | 1.416666 | | |
| 9 | ... | ... | $n = 1.78800$ | $v = 47.4$ |
| 10 | ∞ | 4.409125 | | |
| 11 | −5.99319 | 3.712611 | $n_4 = 1.75520$ | $v_4 = 27.5$ |
| 12 | −86.28751 | 0.048162 | | |
| 13 | −71.18235 | 2.143318 | $n_5 = 1.69350$ | $v_5 = 53.2$ |
| 14 | −10.94487 | 0.027778 | | |
| 15 | −226.45067 | 1.809814 | $n_6 = 1.74400$ | $v_6 = 44.8$ |
| 16 | −17.83232 | 0.339249 | | |
| 17 | 41.06543 | 3.888889 | $n_7 = 1.74400$ | $v_7 = 44.8$ |
| 18 | −86.74715 | | | |

In the table, symbols $d_8$, n and $v$ denote the thickness, the refractive index with respect to the d light and the dispersion value of the plane glass 1', respectively. Other symbols are the same as those in Table 5A. The refractive index $n_e$ of the plane glass 1' at the e line (546.07 nm) is given for reference:

$n_e = 1.79196$

The focal length f, the total field angle $2\theta$, the distance IOD between the object and the image, and the magnification M are as follows:

| | |
|---|---|
| f = 30.494, | $2\theta$ = 18.2° |
| IOD = 100.00, | M = 0.5 |

Figure 13A:
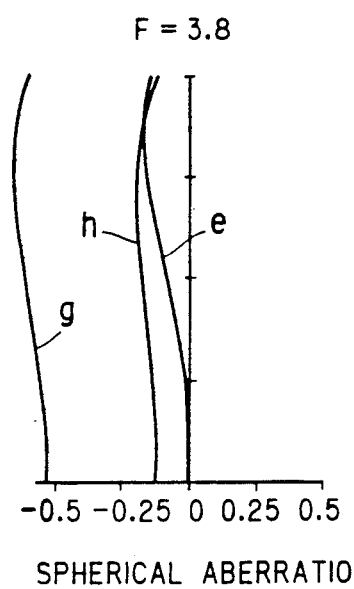
FIGS. 13A and 13B show spherical aberrations of the lens systems shown in FIGS. 12A and 12B, for aligning and for exposing, respectively.
Figure 14A:
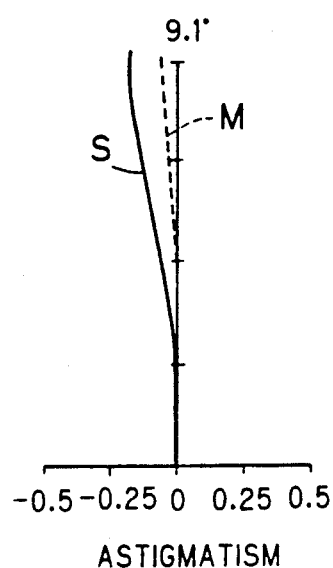
FIGS. 14A and 14B show astigmatisms of the lens systems shown in FIGS. 12A and 12B, respectively.
Figure 15A:
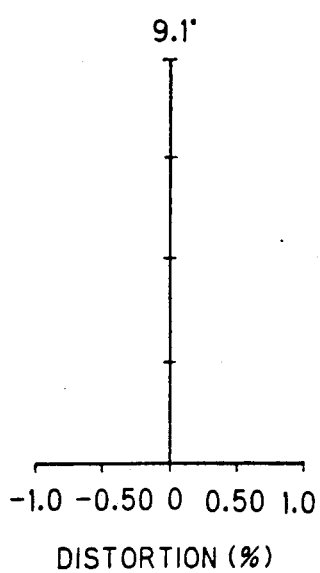
FIGS. 15A and 15B show distortion aberrations of the lens systems shown in FIGS. 12A and 12B, respectively.
Figure 13B:
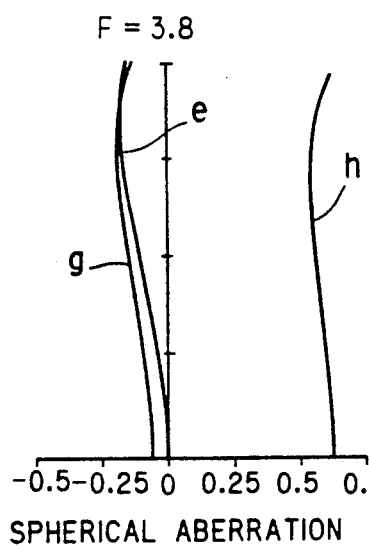
Figure 14B:
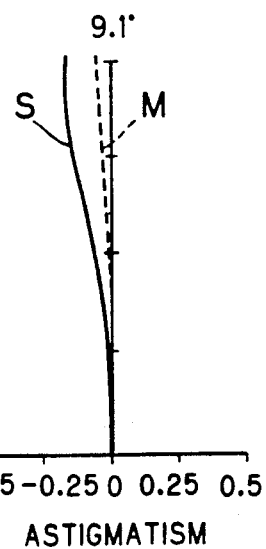
Figure 15B:
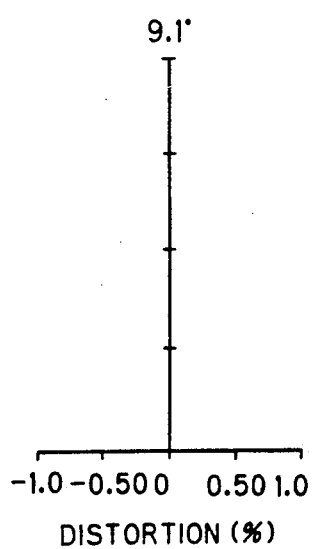

FIGS. 13A and 13B show the spherical aberrations of the first and second lens systems, respectively. FIGS. 14A and 14B show the astigmatisms of the first and second lens systems, respectively. FIGS. 15A and 15B show the distortion aberrations of the first and second lens systems, respectively. In FIGS. 14A and 14B, symbol S (solid lines) and symbol M (dotted lines) represent sagittal and meridional image surfaces with respect to the e line, respectively.

As can be understood from FIGS. 13A and 13B, the first lens system is corrected for chromatic aberration at the e line and the h line, while the second lens system is corrected for chromatic aberration at the e line and the g line. Therefore, corrections of chromatic aberration at three wavelengths, (i.e., the e, g and h lines) can be attained by exchanging the optical elements 1, 1'.

Additionally, the apochromatic lens system illustrated in FIGS. 12A and 12B is telecentric on the image formation side.

In the third embodiment, the plane glass 1' and the plano-concave lens 1a are made of the same material, while the plano-convex lens 1b is made of glass material which is approximate to the mentioned glass material in refractive index but different from the same in dispersion value, as in the first and second embodiments. However, this combination of materials is not limiting.

The third embodiment corrects for chromatic aberration at three wavelengths, i.e., the e, g and h lines, where the e line is the first-wavelength light. Still further, if a combination of glass materials is properly selected, it is possible to correct for chromatic aberration at the e line (first-wavelength light) and two arbitrary wavelengths Table 6 shows examples of combinations which enable such optional corrections.

TABLE 6

| glass material | $n_e$ | $v_e$ |
|---|---|---|
| SK9 | 1.61671 | 54.7 |
| KzFS4 | 1.61673 | 43.6 |
| SSK2 | 1.62508 | 52.9 |
| F11 | 1.62505 | 35.6 |
| LaSF014 | 1.79196 | 47.1 |
| SF11 | 1.79191 | 25.5 |

E-2. Fourth Embodiment

Figure 16A:
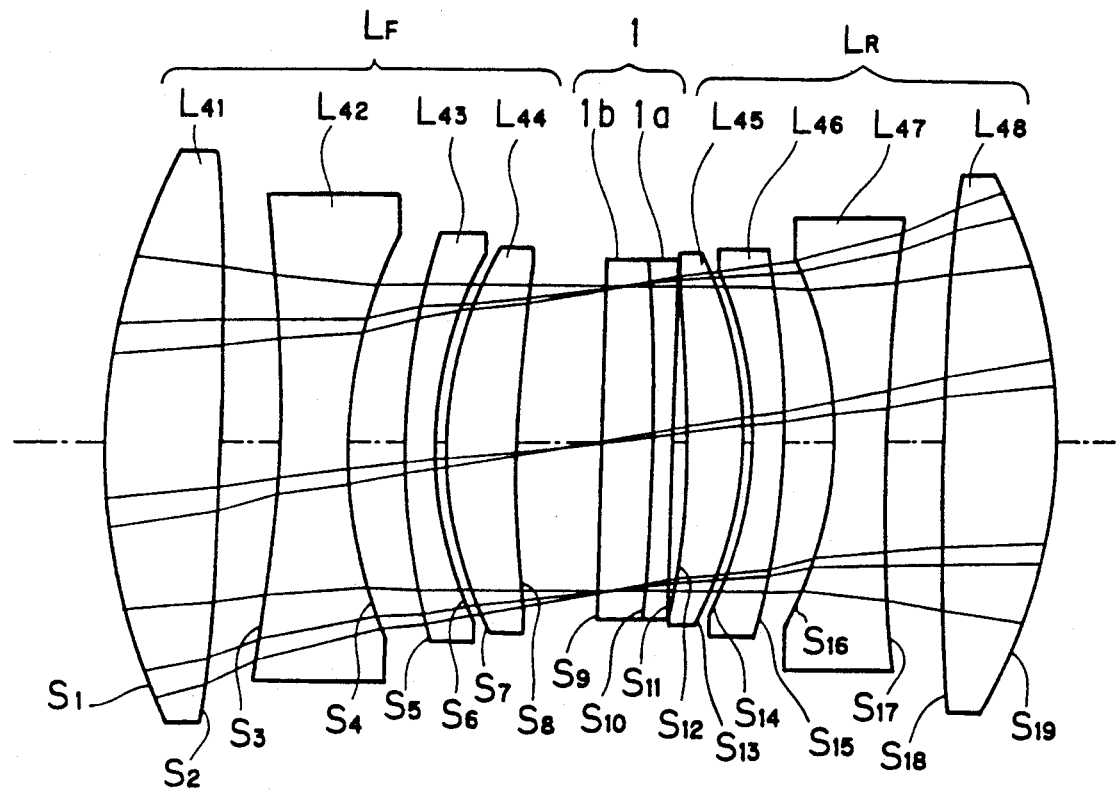
FIGS. 16A and 16B are schematic diagrams of an apochromatic lens system according to a fourth embodiment of the present invention.
Figure 16B:
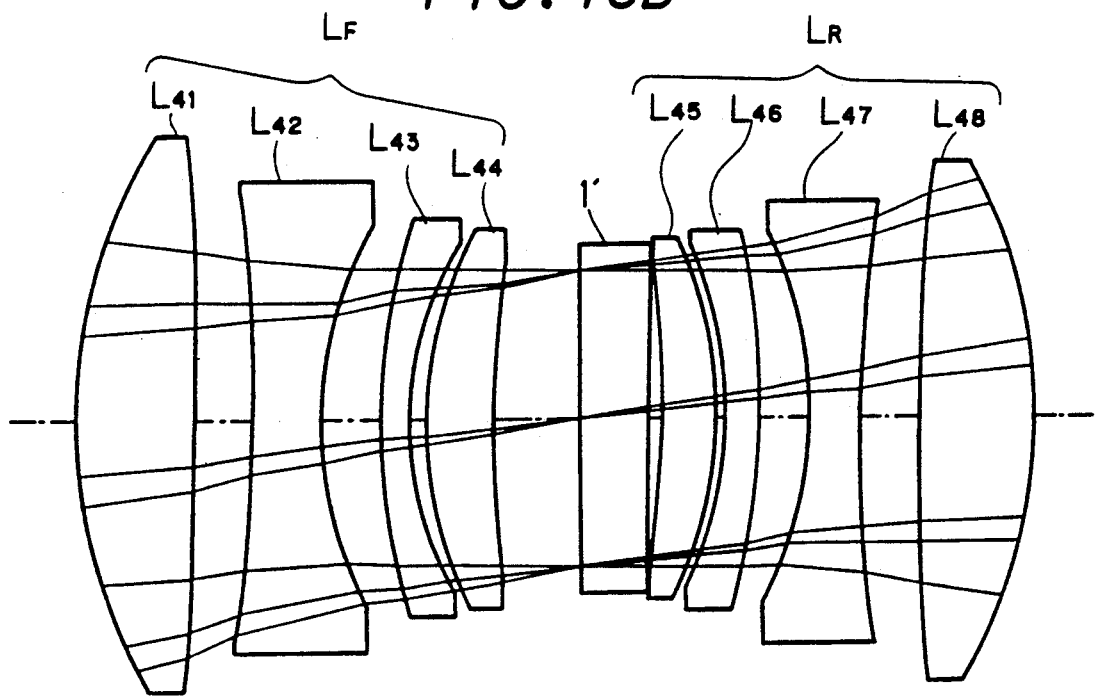

FIGS. 16A and 16B are schematic diagrams of an apochromatic lens system according to a fourth embodiment of the present invention FIG. 16A shows a first structure of the lens system and FIG. 16B shows a second structure of the same. The first lens system includes a front lens group $L_F$, a plane lens 1 and a rear lens group $L_R$, serially arranged from an object side (left-hand side of the figure). The front lens group $L_F$ includes first to fourth lenses $L_{41}$ to $L_{44}$, serially arranged from the object side and spaced apart from each other. The spacings between the four lenses $L_{41}$ to $L_{44}$ will be described later. The plane lens 1 includes plano-concave and pl-no-convex lenses 1a and 1b having the same curvature. The curved surfaces of the lenses 1a and 1b are joined to each other such that the plane lens 1 has parallel planes. The rear lens group $L_R$ includes fifth to eighth lenses $L_{45}$ to $L_{48}$, serially arranged from the object side and spaced apart from each other. The spacings between the four lenses $L_{45}$ to $L_{48}$ will be described later. Table 7A shows the lens data of the first lens system.

TABLE 7A

| k | radius of curvature $r_k$ | value of thickness or spacing $d_k$ | refractive index at d light | dispersion value $v_d$ |
|---|---|---|---|---|
| 1 | 26.64523 | 5.233135 | $n_1 = 1.62041$ | $v_1 = 60.3$ |
| 2 | −163.92645 | 2.636136 | | |
| 3 | −79.94418 | 2.939450 | $n_2 = 1.52944$ | $v_2 = 51.7$ |
| 4 | 19.50754 | 2.780280 | | |
| 5 | 32.21472 | 1.466666 | $n_3 = 1.51633$ | $v_3 = 64.1$ |
| 6 | 18.41080 | 0.388155 | | |
| 7 | 18.17208 | 3.192347 | $n_4 = 1.49700$ | $v_4 = 81.6$ |
| 8 | 71.37663 | 3.779585 | | |
| 9 | ∞ | 2.000000 | $n_{1a} = 1.58921$ | $v_{1a} = 41.1$ |
| 10 | −446.01349 | 1.333333 | $n_{1b} = 1.58913$ | $v_{1b} = 61.2$ |
| 11 | ∞ | 0.399439 | | |
| 12 | −88.65313 | 2.713863 | $n_5 = 1.49700$ | $v_5 = 81.6$ |
| 13 | −19.13591 | 0.453135 | | |
| 14 | −19.56262 | 1.466666 | $n_6 = 1.51633$ | $v_6 = 64.1$ |
| 15 | −35.45453 | 2.305831 | | |
| 16 | −19.39756 | 2.273398 | $n_7 = 1.52944$ | $v_7 = 51.7$ |
| 17 | 74.96778 | 2.634602 | | |
| 18 | 156.28138 | 5.036366 | $n_8 = 1.62041$ | $v_8 = 60.3$ |
| 19 | −25.61406 | | | |

In the table, $r_k$ (k = 1, 2, ..., 19) is the radius of curvature of the le-s surface $S_k$. For example, $r_1$ represents the radius of curvature of a convex surface $S_1$ of the first lens $L_{41}$, and $r_2$ represents the radius of curvature of a surface $S_2$ of the first lens $L_{41}$, which surface faces an image formation side. The symbol $r_{10}$ represents the radius of curvature of the joining surf $S_{10}$ of the plano-concave and plano-convex lenses 1a and 1b. Symbols $d_1$, $d_3$, $d_5$, $d_7$, $d_9$, $d_{10}$, $d_{12}$, $d_{14}$, $d_{16}$ and $d_{18}$ are the thicknesses of the lenses $L_{41}$, $L_{42}$, $L_{43}$, $L_{44}$, 1a, 1b, $L_{45}$, $L_{46}$, $L_{47}$ and $L_{48}$, respectively. Symbols $d_2$, $d_4$ and $d_6$ are the spacings between the adjacent lenses of the four lenses $L_{41}$ to $L_{44}$. Symbol $d_8$ is the spacing between the fourth lens $L_{44}$ and the plane lens 1, while $d_{11}$ is the spacing between the fifth lens $L_{45}$ and the plane lens 1. Symbols $d_{13}$, $d_{15}$ and $d_{17}$ are the spacings between the adjacent lenses of the four lenses $L_{45}$ to $L_{48}$. Symbols $n_1$ to $n_8$ are the indices of refraction of the first to eighth lenses $L_{41}$ to $L_{48}$ at the d light (587.56 nm), respectively. Symbol $n_{1a}$ is the index of refraction of the plano-concave lens 1a, while $n_{1b}$ is the index of refraction of the plano-convex lens 1b. Symbols $v_1$ to $v_8$ denote the dispersion values of the first to eighth lenses $L_{41}$ to $L_{48}$, respectively. The symbols $v_{1a}$ and $v_{1b}$ denote the dispersion values of the plano-concave and plano-convex lenses 1a and 1b, respectively.

The focal length f, the total field angle $2\theta$, the F-number F and the magnification M are as follows:

| | |
|---|---|
| f = 100.00, | $2\theta$ = 19° |
| F = 5.6, | M = 1 |

The second lens system (FIG. 16B) is exactly the same as the first lens system except that the plane glass 1' is used instead of the plane glass 1. The lens data of the second lens system are shown in Table 7B.

TABLE 7B

| k | radius of curvature $r_k$ | value of thickness or spacing $d_k$ | refractive index at d light | dispersion value $v_d$ |
|---|---|---|---|---|
| 1 | 26.64523 | 5.233135 | $n_1$ = 1.62041 | $v_1$ = 60.3 |
| 2 | −163.92645 | 2.636136 | | |
| 3 | −79.94418 | 2.939450 | $n_2$ = 1.52944 | $v_2$ = 51.7 |
| 4 | 19.50754 | 2.780280 | | |
| 5 | 32.21472 | 1.466666 | $n_3$ = 1.51633 | $v_3$ = 64.1 |
| 6 | 18.41080 | 0.388155 | | |
| 7 | 18.17208 | 3.192347 | $n_4$ = 1.49700 | $v_4$ = 81.6 |
| 8 | 71.37663 | 3.779585 | | |
| 9 | ∞ | 3.333333 | | |
| 10 | ... | ... | n = 1.58913 | $v$ = 61.2 |
| 11 | ∞ | 0.399439 | | |
| 12 | −88.65313 | 2.713863 | $n_5$ = 1.49700 | $v_5$ = 81.6 |
| 13 | −19.13591 | 0.453135 | | |
| 14 | −19.56262 | 1.466666 | $n_6$ = 1.51633 | $v_6$ = 64.1 |
| 15 | −35.45453 | 2.305831 | | |
| 16 | −19.39756 | 2.273398 | $n_7$ = 1.52944 | $v_7$ = 51.7 |
| 17 | 74.96778 | 2.634602 | | |
| 18 | 156.28138 | 5.036366 | $n_8$ = 1.62041 | $v_8$ = 60.3 |
| 19 | −25.61406 | | | |

In the table, symbols $d_9$, n and $v$ denote the thickness, the refractive index at the d light and the dispersion value of the plane glass 1', respectively. Other symbols are the same as those of Table 7A.

The focal length f the total field angle $2\theta$, the F-number F and the magnification M are as follows:

| | |
|---|---|
| f = 100.00, | $2\theta$ = 19° |
| F = 5.6, | M = 1 |

Figure 17A:
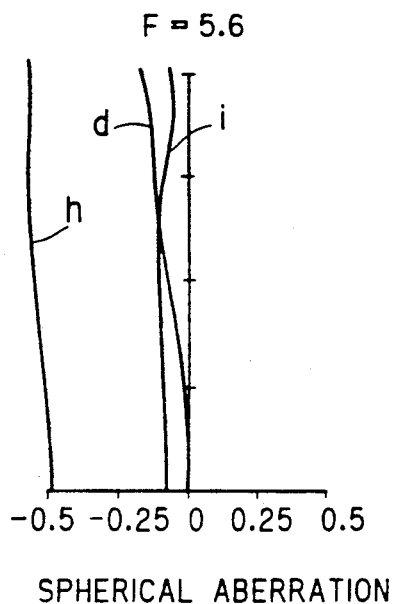
FIGS. 17A and 17B show spherical aberrations of the lens systems shown in FIGS. 16A and 16B, for aligning and for exposing, respectively.
Figure 18A:
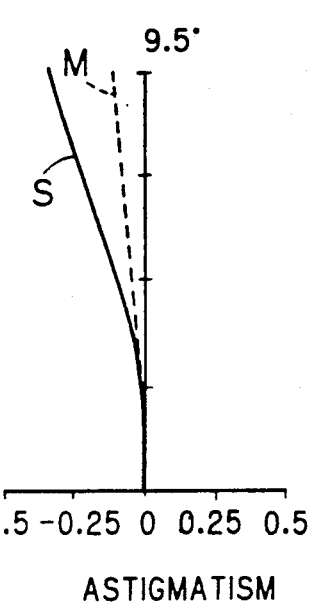
FIGS. 18A and 18B show astigmatisms of the lens systems shown in FIGS. 16A and 16B, respectively.
Figure 19A:
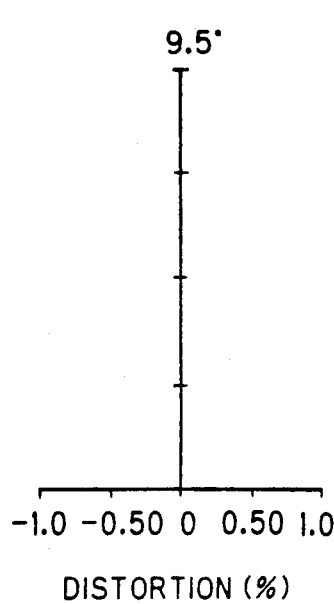
FIGS. 19A and 19B show distortion aberrations of the lens systems shown in FIGS. 16A and 16B, respectively.
Figure 17B:
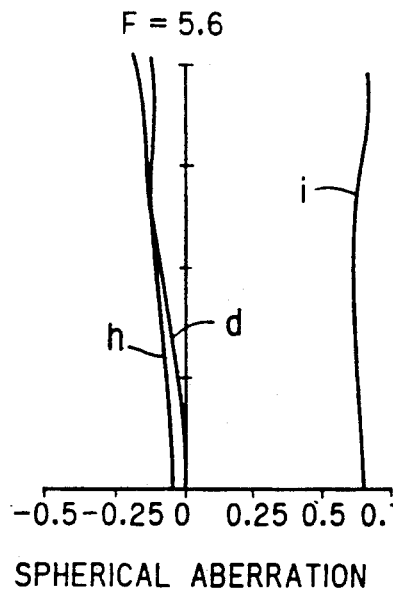
Figure 18B:
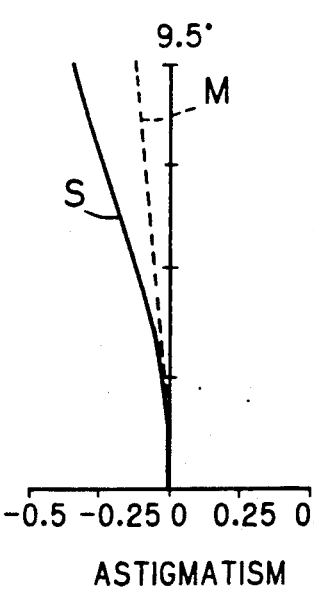
Figure 19B:
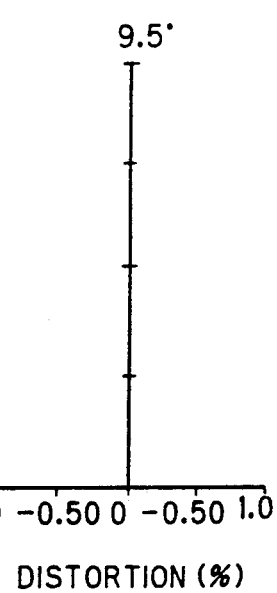

FIGS. 17A and 17B show the spherical aberrations of the alignment and exposure lens systems, respectively. FIGS. 18A and 18B show the astigmatisms of the alignment and exposure lens systems, respectively. FIGS. 19A and 19B show the distortion aberrations of the alignment and exposure lens systems, respectively. In FIGS. 17A and 17B, symbols d, h and i denote the spherical aberrations with respect to the d, h and i (365.01 nm) lines.

In FIGS. 18A and 18, symbol S (solid lines) and symbol M (dotted lines) represent sagittal and meridional image surfaces with respect to the d light, respectively.

The first lens system (FIG. 17A) is corrected for chromatic aberration at the d and i light, while the second lens system (FIG. 17B) is corrected for chromatic aberration at the d and h lines. Therefore, correction for chromatic aberration at three wavelengths, (i.e., the d, h and i lines) can be attained by exchanging the optical elements 1 and 1'.

In the fourth embodiment, the plane glass 1' and the plano-concave lens 1a are made of the same glass material, while the plano-convex lens 1b is made of the glass material which is approximate to the mentioned glass material in refractive index but different from the same in dispersion value. This combination of materials is not limiting.

The third embodiment has been corrected for chromatic aberration at three wavelengths, i.e., the d, h and i lines, where the e line is the first-wavelength light. If a combination of glass materials is properly selected, the lens system may be corrected for chromatic aberration at the e line (first-wavelength light) and at two arbitrary wavelengths Table 8 shows examples of combinations which enable such optional corrections.

TABLE 8

| glass material | $n_d$ | $v_d$ |
|---|---|---|
| SK5 | 1.58913 | 61.2 |
| LF2 | 1.58921 | 41.1 |
| SK16 | 1.62041 | 60.3 |
| F9 | 1.62045 | 38.1 |
| LaK10 | 1.72000 | 50.2 |
| SF01 | 1.72022 | 29.3 |

Figure 21:
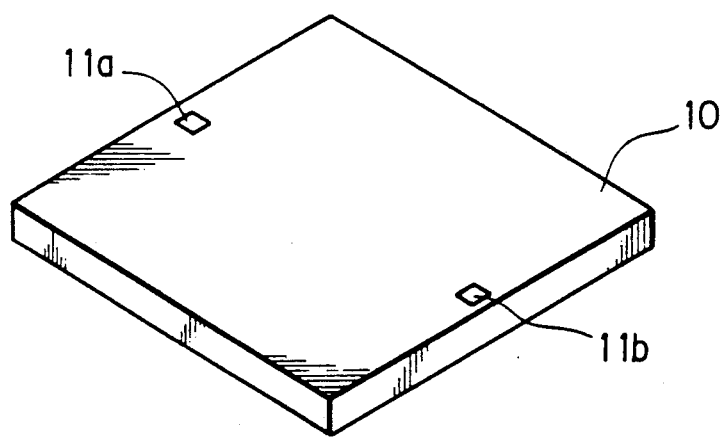
FIG. 21 is a perspective view of a photomask.
Figure 22:
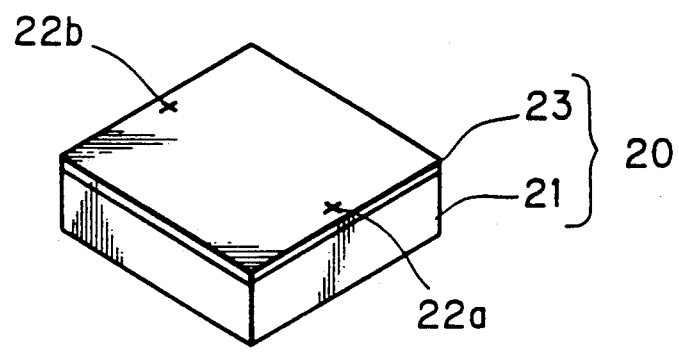
FIG. 22 is a perspective view of a semiconductor device.

FIGS. 20A and 20B illustrate an exposing apparatus which employs the apochromatic lens system according to the first embodiment of the present invention. The exposing apparatus is used for transcribing a mask pattern of a photomask 10 (FIG. 21) on a semiconductor device 20 (FIG. 22). Marks 11a and 11b (FIG. 21) for aligning mask patterns are provided in prescribed positions on a surface of the photomask 10. Cross marks 22a and 22b (FIG. 22) are provided on a substrate 21 of the semiconductor device 20 correspondingly to the positions of the marks 11a and 11b. The semiconductor device 20 includes a photoresist layer 22.

Figure 23:
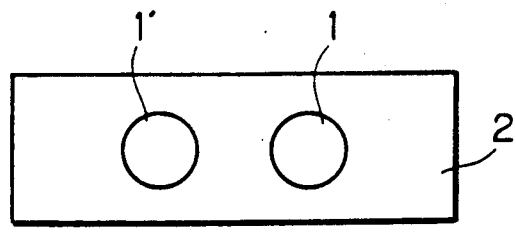
FIG. 23 illustrates a holder holding a plane lens and a plane glass.

As shown in FIG. 20A, the exposing apparatus includes an illumination unit 31a for emitting the e line. Light from the illumination unit 31a is reflected at a half mirror 34a provided in a housing 33, and leads to a projection lens system 35. The projection lens system 35 is identical in structure to the above-described apochromatic lens system according to the first embodiment. A holder 2 holds a plane lens 1 and a plane glass 1' as shown in FIG. 23. Thus, either the plane lens 1 or the plane glass 1' is disposed on the optical axis of the projection lens system 35 by positioning the holder 2.

Light radiations 36a of the e line are incident upon a surface 21a of the substrate 21 in the vicinity of alignment mark 22A. Thus, the vicinity of the alignment mark 22a is illuminated. Light radiations 37a reflected from the substrate surface 21a are focused at the mark 11a placed on the photomask 10 through the projection lens system 35 and the half mirror 34a. Then, overlapped images of the marks 11a and 22a are received in a camera unit 39a.

The exposing apparatus also includes an illumination unit 31b for emitting the e line. The exposing apparatus is designed as above so as to allow overlapped images of the marks 11b and 22b to be received in a camera unit 39b.

As shown in FIG. 20B, an illumination optical system 41 is provided above the photomask 10 to irradiate with the g and the h line. The illumination optical system 41 emits light radiations 42 of the q line and the h line. The light radiations 43 transmitted through the photomask 10 irradiate a photoresist layer 23. As a result, the portion of the photoresist layer 23 which corresponds only to a pattern (not shown) formed on the photomask 10 photochemically changes.

The illumination units 31a and 31b, the half mirrors 34a and 34b and the camera units 39a and 39b can be moved between the positions shown in FIG. 20A and positions where they do not intercept light radiation from the illumination optical system 41. The holder 2 is also movable along an X direction. Accordingly, during alignment[the illumination units 31a and 31b and the other units can be placed in prescribed positions to obtain overlapped images of marks of the photomask 10 and alignment marks of the substrate 21 (FIG. 20A). During exposure, the illumination units 31a and 31h and the other units are set back to prescribed withdrawn positions while the plane glass 1' is placed on the optical axis of the projection lens system 35, to allow the g line and the h line to irradiate the photoresist layer 23.

Figure 24:
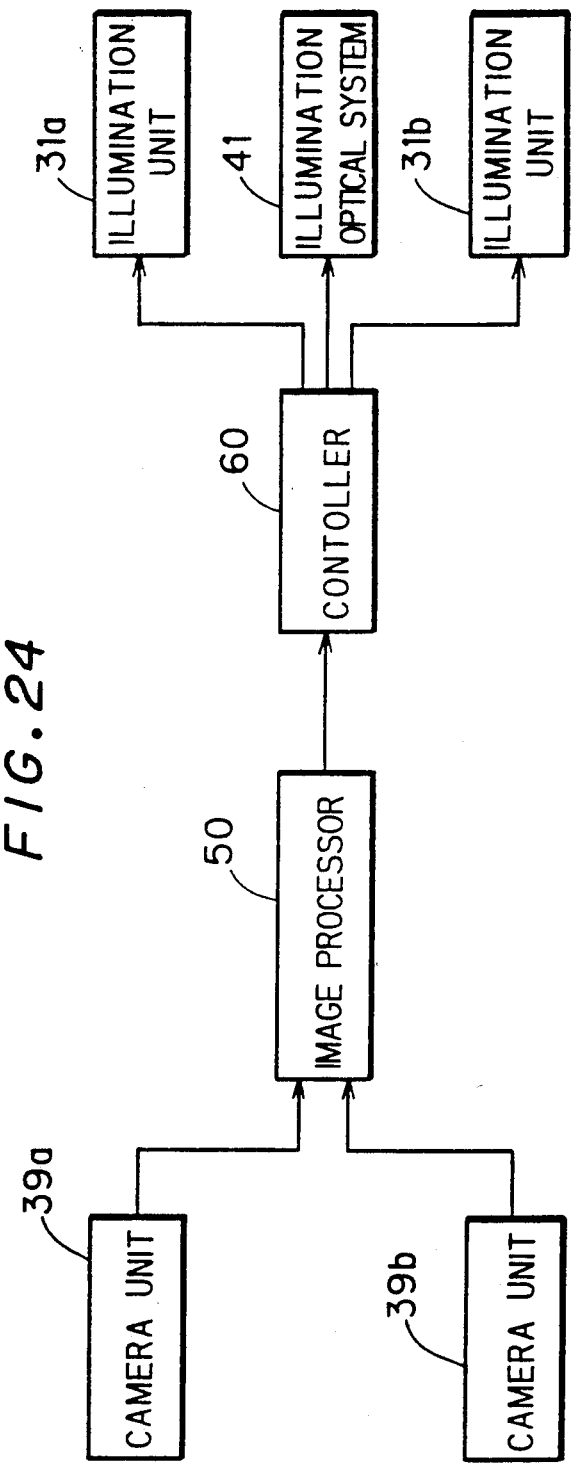
FIG. 24 is a block diagram of electrical structures of the exposing apparatus.
Figure 26:
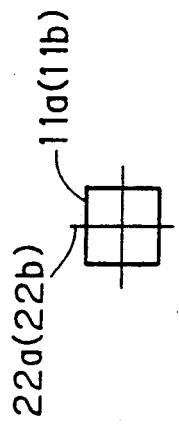
FIG. 26 illustrates overlapped images of a photomask mark and an alignment mark.

FIG. 24 is a block diagram showing electrical structures of the exposing apparatus. As set forth in the diagram, image data obtained in the camera units 39a and 39b are supplied to an image processor 50, and are processed therein according to predetermined procedures. Processed image data are then provided to a controller 60. The controller 60, which is connected with respective units of the exposing apparatus, e.g., the illumination units 39a and 39b and the illumination optical system 41, carries out alignment and exposure. &he controller 60 controls the whole apparatus.

Figure 25:
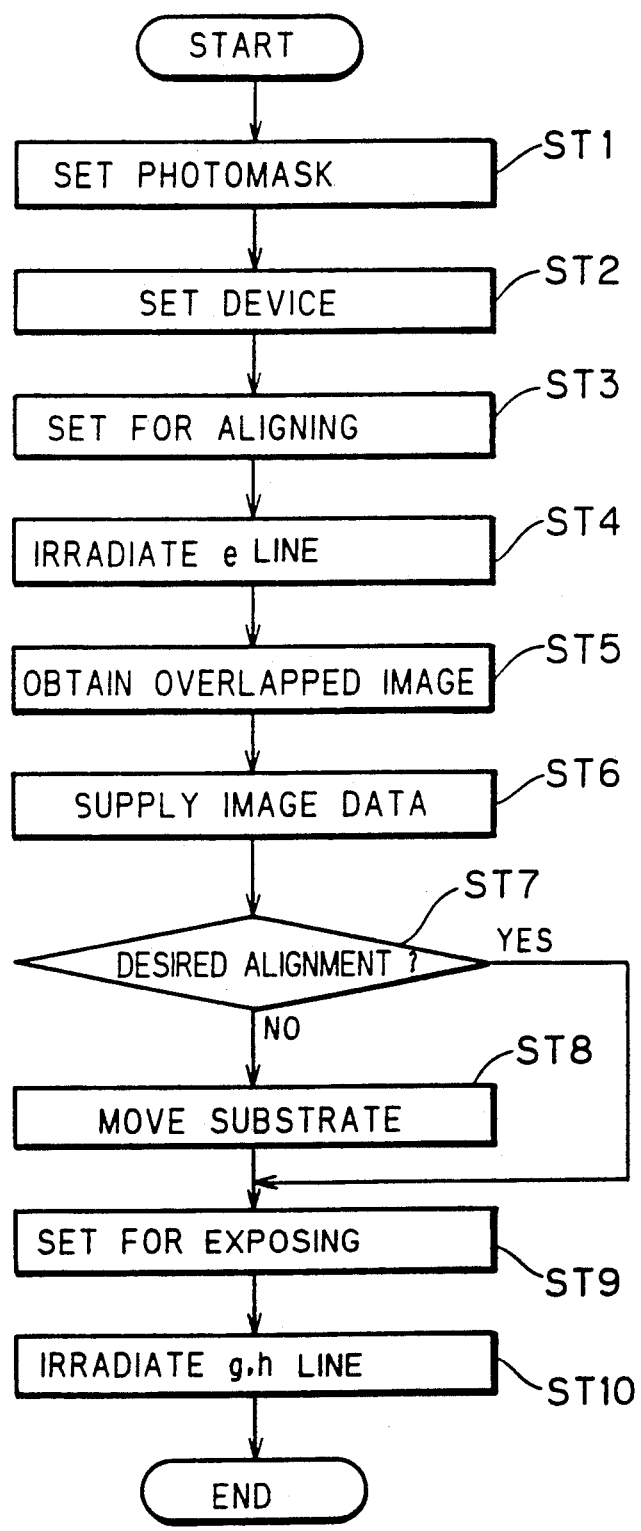
FIG. 25 is a flow chart of operations of the exposing apparatus.

FIG. 25 is a flow chart showing operations of the exposing apparatus. The photomask 10 14 is first set in a prescribed position (Step ST1), then the semiconductor device 20 is set in a position to be exposed (Step ST2). In response, the controller 60 issues an instruction such that the illumination units 31a and 31b, the half mirrors 34a and 34b and the camera units 39a and 39b are moved to the alignment positions shown in FIG. 20A (Step ST3). At the same time, the holder 2 places the plane lens 1 on the optical axis of the projection lens system 35. Thereafter, the illumination units 39a and 39b emit the e line light and thereby illuminate the surface to be exposed, i.e., the surface 21a (Step ST4). Light radiations reflected at the exposing surface are focused at the marks 11a and 11b on the photomask 10. Then, overlapped images of the marks 11a, 22a and the marks 11b, 22b are obtained by the camera units 39a and 39b (Step ST5). Next, in Step ST6, the data of the overlapped images are supplied to the image processor 50, and are processed therein according to predetermined procedures. Then in Step ST7, it is judged whether or not the marks 11a and 11b and the alignment marks 22a and 22b are properly aligned. Step ST9 is then carried out if it is judged that there is proper alignment. On the contrary, if it is judged that the desired alignment of the marks is not obtained, Step ST8 is carried out prior to Step ST9. In other words, the substrate 21 is moved until the marks 11a and 11b and the alignment marks 22a and 22b are properly aligned.

The illumination units 31a and 31b, the half mirrors 34a and 34b and the camera units 39a and 39b are withdrawn in response to an instruction from the controller 60 in Step ST9. At the same time, the holder 2 moves the plane glass 1' onto the optical axis of the projection lens system 35. Therefore, in Step ST10, the illumination optical system 41 emits the e-line and h line light, thus eventually irradiating the surface 21a, transcribing the pattern of the photomask 10 onto the photoresist 23 for a short time.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. An apochromatic system, comprising:
a lens system with an optical axis;
a planar glass element which is positionable on said optical axis of said lens system, said planar glass element cooperating with said lens system to correct for chromatic aberration at first and second wavelengths when said planar glass element is positioned on said optical axis of said lens system, said planar glass element having a thickness; and
a lens formed by (a) a plano-convex lens with a convex surface and (b) a plano-concave lens with a concave surface, said concave surface of said plano-concave lens facing said convex surface of said plano-convex lens, said lens having a thickness which is identical to said thickness of said planar glass element, said lens being interchangeable with said planar glass element and positionable on said optical axis of said lens system, said lens cooperating with said lens system to correct for chromatic aberration at said first wavelength and a third wavelength when said lens is positioned on said optical axis of said lens system.

2. An apochromatic system of claim 1, wherein one of said plano-convex lens and said plano-concave lens is made of a first glass material and the other is made of a second glass material approximate to said first glass material in refractive index but different from said first glass material in dispersion value.

3. An apochromatic system of claim 1, wherein said convex and concave surfaces have the same radius of curvature.

4. An apochromatic system of claim 3, wherein said convex and concave surfaces are joined to each other.

5. An apochromatic system of claim 1, wherein said lens system comprises first and second lens groups.

6. An apochromatic system of claim 5, wherein said planar glass element and said lens are interchangeably positionable between said first and second lens groups.

7. An apochromatic system of claim 1, wherein said planar glass element is selectively movable along said optical axis of said lens system.

8. An apochromatic system of claim 2, wherein said planar glass element is made of glass material, said first glass material being the same material as said glass material of said planar glass element.

* * * * *